US012272620B2

(12) United States Patent
Shih

(10) Patent No.: US 12,272,620 B2
(45) Date of Patent: Apr. 8, 2025

(54) SEMICONDUCTOR STRUCTURE HAVING ELASTIC MEMBER WITHIN VIA

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 485 days.

(21) Appl. No.: 17/751,941

(22) Filed: May 24, 2022

(65) Prior Publication Data

US 2023/0386968 A1 Nov. 30, 2023

(51) Int. Cl.
*H01L 23/48* (2006.01)
*H01L 23/00* (2006.01)

(52) U.S. Cl.
CPC .......... *H01L 23/481* (2013.01); *H01L 23/562* (2013.01)

(58) Field of Classification Search
CPC .............................. H01L 23/562; H01L 23/481
See application file for complete search history.

(56) References Cited

U.S. PATENT DOCUMENTS

| 6,809,421 | B1 * | 10/2004 | Hayasaka | ............... H01L 25/50 |
| | | | | 257/621 |
| 2005/0121768 | A1 * | 6/2005 | Edelstein | .......... H01L 23/49827 |
| | | | | 257/E23.067 |
| 2011/0204517 | A1 * | 8/2011 | Gu | ........................ H01L 23/481 |
| | | | | 438/653 |

FOREIGN PATENT DOCUMENTS

CN 113725189 A 11/2021
WO WO2021015827 A1 1/2021

OTHER PUBLICATIONS

Office Action dated on Sep. 22, 2023 related to Taiwanese Application No. 112108109.
Office Action dated on Jun. 28, 2023 related to Taiwanese Application No. 111140163.

* cited by examiner

*Primary Examiner* — Mark W Tornow
(74) *Attorney, Agent, or Firm* — Xuan Zhang

(57) ABSTRACT

The present application provides a semiconductor structure having an elastic member within a via. The semiconductor structure includes a wafer including a substrate, a dielectric layer under the substrate, and a conductive pad surrounded by the dielectric layer; a passivation layer disposed over the substrate; a conductive via extending from the conductive pad through the substrate and the passivation layer and partially through the dielectric layer; and an elastic member disposed within the conductive via.

20 Claims, 28 Drawing Sheets

SEMICONDUCTOR STRUCTURE HAVING ELASTIC MEMBER WITHIN VIA

TECHNICAL FIELD

The present disclosure relates to a semiconductor structure. Particularly, the present disclosure relates to a semiconductor structure having an elastic member within a via.

DISCUSSION OF THE BACKGROUND

Semiconductor devices are used in a variety of electronic applications, such as personal computers, cellular telephones, digital cameras, and other electronic equipment. Fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve integration density of the microelectronic components by continual reduction of minimum feature size, which allows more components to be integrated into a given area. Smaller package structures with smaller footprints are developed to package the semiconductor devices, in order to facilitate formation and integration of components of different sizes. However, such formation and integration may increase complexity of manufacturing processes. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a wafer including a substrate, a dielectric layer under the substrate, and a conductive pad surrounded by the dielectric layer; a passivation layer disposed over the substrate; a conductive via extending from the conductive pad through the substrate and the passivation layer and partially through the dielectric layer; and an elastic member disposed within the conductive via.

In some embodiments, the elastic member is surrounded by the substrate and the passivation layer.

In some embodiments, the elastic member includes organic material.

In some embodiments, the semiconductor structure further includes a dielectric liner between the conductive via and the wafer, and between the conductive via and the passivation layer.

In some embodiments, the dielectric liner surrounds the conductive via and the elastic member.

In some embodiments, a height of the conductive via is substantially greater than a height of the elastic member.

In some embodiments, the semiconductor structure further comprises a conductive barrier layer surrounding the conductive via and the elastic member.

In some embodiments, the conductive barrier layer is in contact with the conductive via and the conductive pad.

In some embodiments, at least a portion of the dielectric layer is disposed between the substrate and the conductive pad.

Another aspect of the present disclosure provides a semiconductor structure. The semiconductor structure includes a first wafer including a first substrate, a first dielectric layer under the first substrate, and a first conductive pad surrounded by the first dielectric layer; a first passivation layer disposed over the first substrate; a first conductive via extending from the first conductive pad through the first substrate and the first passivation layer and partially through the first dielectric layer; a first elastic member disposed within the first conductive via; a second wafer including a second dielectric layer bonded over the first passivation layer, a second substrate over the second dielectric layer, and a second conductive pad surrounded by the second dielectric layer; a second passivation layer disposed over the second substrate; a second conductive via extending from the second conductive pad through the second substrate and the second passivation layer and partially through the second dielectric layer; and a second elastic member disposed within the second conductive via.

In some embodiments, the second dielectric layer is in contact with the first conductive via.

In some embodiments, the semiconductor structure further comprises a third conductive pad electrically connected to the first conductive pad and at least partially exposed through the first dielectric layer; and a fourth conductive pad electrically connected to the second conductive pad and at least partially exposed through the second dielectric layer.

In some embodiments, the first conductive via is in contact with the fourth conductive pad.

In some embodiments, the third conductive pad is under the first conductive pad, and the fourth conductive pad is under the second conductive pad.

In some embodiments, the first conductive via is electrically connected to the second conductive via through the second conductive pad and the fourth conductive pad.

In some embodiments, the second conductive pad and the fourth conductive pad are disposed between the first conductive via and the second conductive via.

In some embodiments, the first conductive via is vertically aligned with the second conductive via, and the first conductive pad is vertically aligned with the second conductive pad.

In some embodiments, the first elastic member is vertically aligned with the second elastic member.

In some embodiments, the first conductive via is laterally offset from the second conductive via, and the first elastic member is laterally offset from the second elastic member.

In some embodiments, a thickness of the first wafer is substantially equal to a thickness of the second wafer.

Another aspect of the present disclosure provides a method of manufacturing a semiconductor structure. The method includes steps of providing a first wafer including a first substrate, a first dielectric layer under the first substrate, and a first conductive pad surrounded by the first dielectric layer; disposing a first passivation layer over the first substrate; removing portions of the first dielectric layer, the first substrate and the first passivation layer to form a first opening exposing a portion of the first conductive pad; disposing a first conductive material within the first opening; disposing a first elastic material within the first opening and surrounded by the first conductive material; removing portions of the first conductive material and the first elastic material adjacent to an end of the first opening to form a first elastic member; and disposing a second conductive material over the first elastic member and the first conductive material to form a first conductive via, wherein the first conductive via surrounds the first elastic member.

In some embodiments, the portions of the first conductive material and the first elastic material are removed by an etch-back process.

In some embodiments, the method further comprises removing portions of the first conductive material and the first elastic material over the first passivation layer by a planarization process after the disposing of the first conductive material and the first elastic material.

In some embodiments, the first conductive material and the second conductive material include a same material.

In some embodiments, the first elastic material includes organic material.

In some embodiments, the method further comprises grinding the first substrate to reduce a thickness of the first substrate prior to the disposing of the first passivation layer.

In some embodiments, a third conductive pad is formed under the first conductive pad, wherein the third conductive pad is electrically connected to the first conductive pad and at least partially exposed through the first dielectric layer.

In some embodiments, the method further comprises disposing a dielectric liner conformal to the first opening prior to the disposing of the first conductive material.

In some embodiments, a portion of the dielectric liner on the first conductive pad is removed.

In some embodiments, the method further comprises providing a second wafer including a second substrate, a second dielectric layer under the second substrate, and a second conductive pad surrounded by the second dielectric layer; bonding the second dielectric layer over the first passivation layer; disposing a second passivation layer over the second substrate; removing portions of the second dielectric layer, the second substrate and the second passivation layer to form a second opening exposing a portion of the second conductive pad; disposing a third conductive material within the second opening; disposing a second elastic material within the second opening and surrounded by the third conductive material; removing portions of the third conductive material and the second elastic material adjacent to an end of the second opening to form a second elastic member; and disposing a fourth conductive material over the second elastic member and the third conductive material to form a second conductive via, wherein the second conductive via surrounds the second elastic member.

In some embodiments, the bonding of the second dielectric layer over the first passivation layer is implemented after the formation of the first conductive via and the first elastic member.

In some embodiments, a fourth conductive pad is formed under the second conductive pad, wherein the fourth conductive pad is electrically connected to the second conductive pad and at least partially exposed through the second dielectric layer.

In some embodiments, the method further comprises bonding the fourth conductive pad to the first conductive via upon the bonding of the second dielectric layer over the first passivation layer.

In some embodiments, a width of the first conductive via is substantially greater than a width of the fourth conductive pad.

In some embodiments, a width of the second conductive pad is substantially greater than a width of the fourth conductive pad.

In conclusion, because an elastic member capable of absorbing force is disposed within a via, a bonding force generated and applied over the via during a wafer-to-wafer bonding process can be effectively absorbed by the elastic member. Further, the elastic member is also capable of absorbing thermal stress from adjacent components such as the via during the bonding process. Therefore, formation of cracks within a wafer's bonded structure or damages to the wafer's bonded structure can be minimized or prevented.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
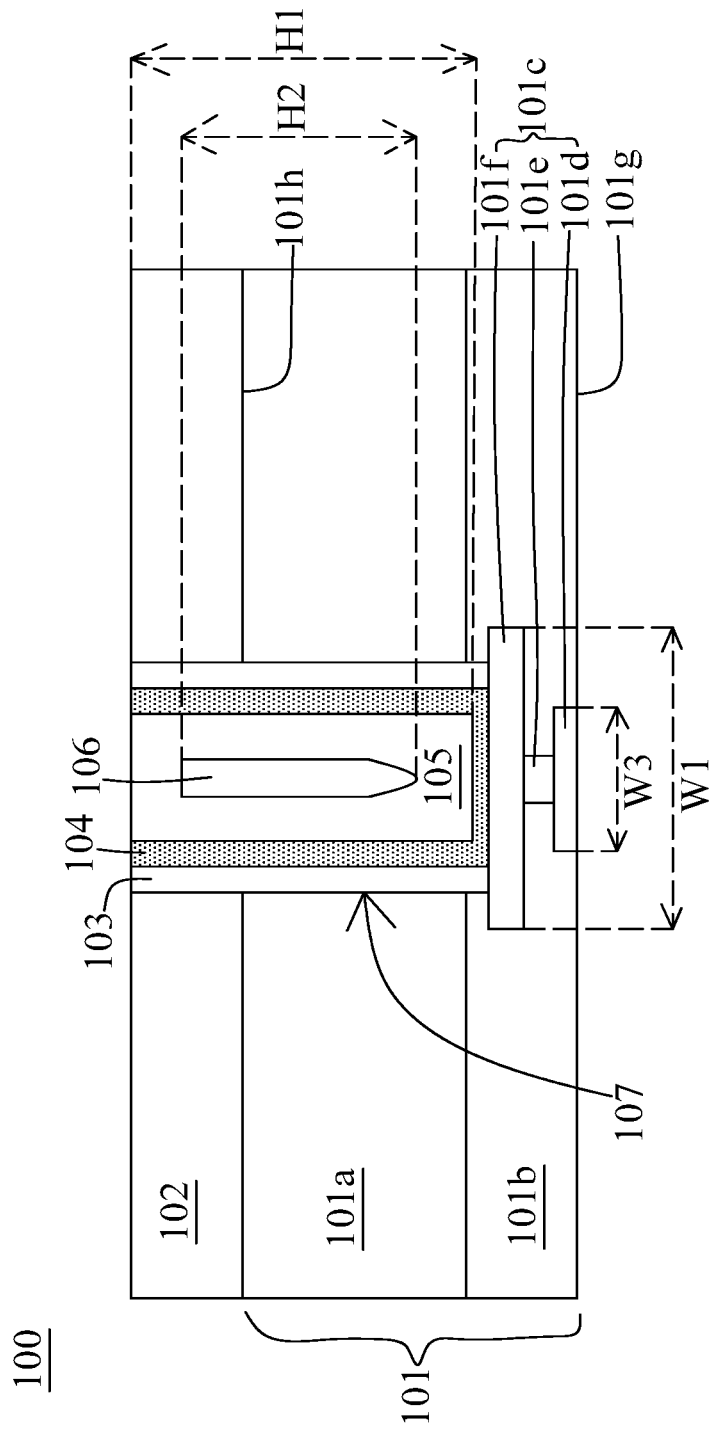
FIG. 1 is a cross-sectional view of a first semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a first semiconductor structure 100 in accordance with some embodiments of the present disclosure. In some embodiments, the first semiconductor structure 100 is a part of a die, a package or a device. In some embodiments, the first semiconductor structure 100 is a die, a package or a device. In some embodiments, the first semiconductor structure 100 includes a first wafer 101, a first passivation layer 102 over the first wafer 101, a first conductive via 105 extending at least partially through the first wafer 101, and a first elastic member 106 surrounded by the first conductive via 105.

In some embodiments, the first wafer 101 is a workpiece that includes various features formed in or over the first wafer 101. In some embodiments, the first wafer 101 is in various stages of fabrication and is processed using various processes. In some embodiments, the first wafer 101 includes a variety of electrical circuits suitable for a particular application. In some embodiments, FIG. 1 illustrates a part of the first wafer 101. In some embodiments, a top surface of the first wafer 101 has a circular shape or any other suitable shape.

In some embodiments, the first wafer 101 includes a first substrate 101a, a first dielectric layer 101b and a first interconnect structure 101c surrounded by the first dielectric layer 101b. In some embodiments, the first substrate 101a is a part of the first wafer 101. In some embodiments, the first substrate 101a is a semiconductive layer. In some embodiments, the first substrate 101a includes semiconductive material such as silicon, germanium, gallium, arsenic, or a combination thereof. In some embodiments, the first substrate 101a is a silicon substrate.

In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are subsequently formed in or over the first substrate 101a and configured to electrically connect to an external circuitry.

In some embodiments, the first dielectric layer 101b is disposed under the first substrate 101a. In some embodiments, the first dielectric layer 101b includes dielectric material such as oxide, nitride, silicon dioxide, silicon nitride, silicon oxynitride, silicon carbide, polymer or the like. In some embodiments, the first dielectric layer 101b includes several dielectric layers stacked over each other. In some embodiments, each of the dielectric layers includes materials that are same as or different from materials in others of the dielectric layers.

In some embodiments, the first wafer 101 is defined with a first surface 101g and a second surface 101h opposite to the first surface 101g. In some embodiments, the first surface 101g is a front side of the first wafer 101, and the second surface 101h is a back side of the first wafer 101. In some embodiments, various features are formed in or over the first surface 101g of the first wafer 101.

In some embodiments, the first interconnect structure 101c includes a first conductive pad 101f, a third conductive pad 101d and a first via 101e between the first conductive pad 101f and the third conductive pad 101d. In some embodiments, the first conductive pad 101f is surrounded by the first dielectric layer 101b. In some embodiments, the first conductive pad 101f is at least partially exposed through the first dielectric layer 101b.

In some embodiments, the first conductive pad 101f extends laterally in the first dielectric layer 101b. In some embodiments, a portion of the first dielectric layer 101b is disposed between the first substrate 101a and the first conductive pad 101f. In some embodiments, the first conductive pad 101f includes conductive material such as gold, silver, copper, nickel, tungsten, aluminum, tin, alloys thereof or the like. In some embodiments, a top surface of the first conductive pad 101f has a circular or polygonal shape.

In some embodiments, the third conductive pad 101d is disposed under the first conductive pad 101f and surrounded by the first dielectric layer 101b. In some embodiments, the third conductive pad 101d is at least partially exposed through the first dielectric layer 101b. In some embodiments, the third conductive pad 101d extends laterally in the first dielectric layer 101b. In some embodiments, the third conductive pad 101d is disposed adjacent to the first surface 101g of the first wafer 101.

In some embodiments, the third conductive pad 101d is configured to electrically connect to a die, a package or a circuitry external to the semiconductor structure 100. In some embodiments, a width W1 of the first conductive pad 101f is substantially greater than a width W3 of the third conductive pad 101d. In some embodiments, the third conductive pad 101d includes conductive material such as gold, silver, copper, nickel, tungsten, aluminum, tin, alloys thereof or the like. In some embodiments, a top surface of the third conductive pad 101d has a circular or polygonal shape.

In some embodiments, the first conductive pad 101f is electrically connected to the third conductive pad 101d through the first via 101e. In some embodiments, the first via 101e is surrounded by the first dielectric layer 101b and is in contact with the first conductive pad 101f and the third conductive pad 101d. In some embodiments, the first via 101e includes conductive material such as gold, silver, copper, nickel, tungsten, aluminum, tin, alloys thereof or the like. In some embodiments, a top surface of the first via 101e has a circular or polygonal shape.

In some embodiments, the first passivation layer 102 is disposed over the first wafer 101. In some embodiments, the first passivation layer 102 is disposed over the first substrate 101a. In some embodiments, the first passivation layer 102 is disposed on the second surface 101h of the first wafer 101. In some embodiments, the first passivation layer 102 includes dielectric materials, such as spin-on glass (SOG), silicon oxide, silicon oxynitride, silicon nitride or the like. In some embodiments, the first passivation layer 102 includes polymer, BCB, PBO, PI or the like.

In some embodiments, the first semiconductor structure 100 includes a first opening 107 extending from the first conductive pad 101f through the first substrate 101a and the first passivation layer 102 and partially through the first dielectric layer 101b. In some embodiments, the first opening 107 is above the first interconnect structure 101c.

In some embodiments, the first conductive via 105 is disposed within the first opening 107. In some embodiments, the first conductive via 105 is surrounded by the first dielectric layer 101b, the first substrate 101a and the first passivation layer 102. In some embodiments, the first conductive via 105 extends from and is electrically connected to the first conductive pad 101f. In some embodiments, the first conductive via 105 is substantially orthogonal to the first conductive pad 101f.

In some embodiments, the first conductive via 105 is a through substrate via (TSV). In some embodiments, the first conductive via 105 includes conductive material such as gold, silver, copper, nickel, tungsten, aluminum, tin, alloys thereof or the like. In some embodiments, a top surface of the first conductive via 105 has a circular or polygonal shape. In some embodiments, the first conductive via 105 has a cylindrical shape. In some embodiments, the first conductive via 105 has a consistent width along a height H1 of the first conductive via 105.

In some embodiments, the first elastic member 106 is disposed within the first conductive via 105. In some embodiments, the first elastic member 106 is surrounded by the first substrate 101a and the first passivation layer 102. In some embodiments, the first elastic member 106 extends toward the first conductive pad 101f. In some embodiments, the first elastic member 106 is above the first interconnect structure 101c. In some embodiments, the first elastic member 106 includes organic material.

In some embodiments, the first elastic member 106 includes polymer, resin, epoxy or the like. In some embodiments, the first elastic member 106 is flexible and compressible. In some embodiments, the first elastic member 106 is configured to absorb a force or a stress generated during a manufacturing process. In some embodiments, a height H2 of the first elastic member 106 is substantially less than the height H1 of the first conductive via 105.

In some embodiments, the first semiconductor structure 100 includes a first dielectric liner 103 between the first wafer 101 and the first conductive via 105. In some embodiments, the first dielectric liner 103 is between the first conductive via 105 and the first passivation layer 102. In some embodiments, the first dielectric liner 103 surrounds the first conductive via 105 and the first elastic member 106. In some embodiments, the first dielectric liner 103 is disposed conformal to the first opening 107. In some embodiments, the first dielectric liner 103 is in contact with the first conductive pad 101f exposed through the first dielectric layer 101b. In some embodiments, the first dielectric liner 103 includes dielectric material such as oxide or the like.

In some embodiments, the first semiconductor structure 100 includes a first conductive barrier layer 104 surrounding the first conductive via 105 and the first elastic member 106. In some embodiments, the first conductive barrier layer 104 is disposed within the first opening 107, conformal to the dielectric liner 103, and in contact with the first conductive pad 101f exposed through the first dielectric layer 101b. In some embodiments, the first conductive barrier layer 104 and the first conductive via 105 are electrically connected to the first interconnect structure 101c. In some embodiments, the first conductive barrier layer 104 is in contact with the first conductive via 105 and the first conductive pad 101f.

In some embodiments, the first conductive barrier layer 104 includes titanium, titanium nitride, tantalum, tantalum nitride, nickel or the like. In some embodiments, the first conductive barrier layer 104 serves as a diffusion barrier layer for preventing diffusion of the first conductive via 105. In some embodiments, a first seed layer is disposed between the first conductive barrier layer 104 and the first conductive via 105. In some embodiments, the first seed layer includes titanium, copper, nickel, gold or the like. In some embodiments, a top surface of the first passivation layer 102, a top surface of the first dielectric liner 103, and a top surface of the first conductive via 105 are substantially coplanar.

Figure 2:
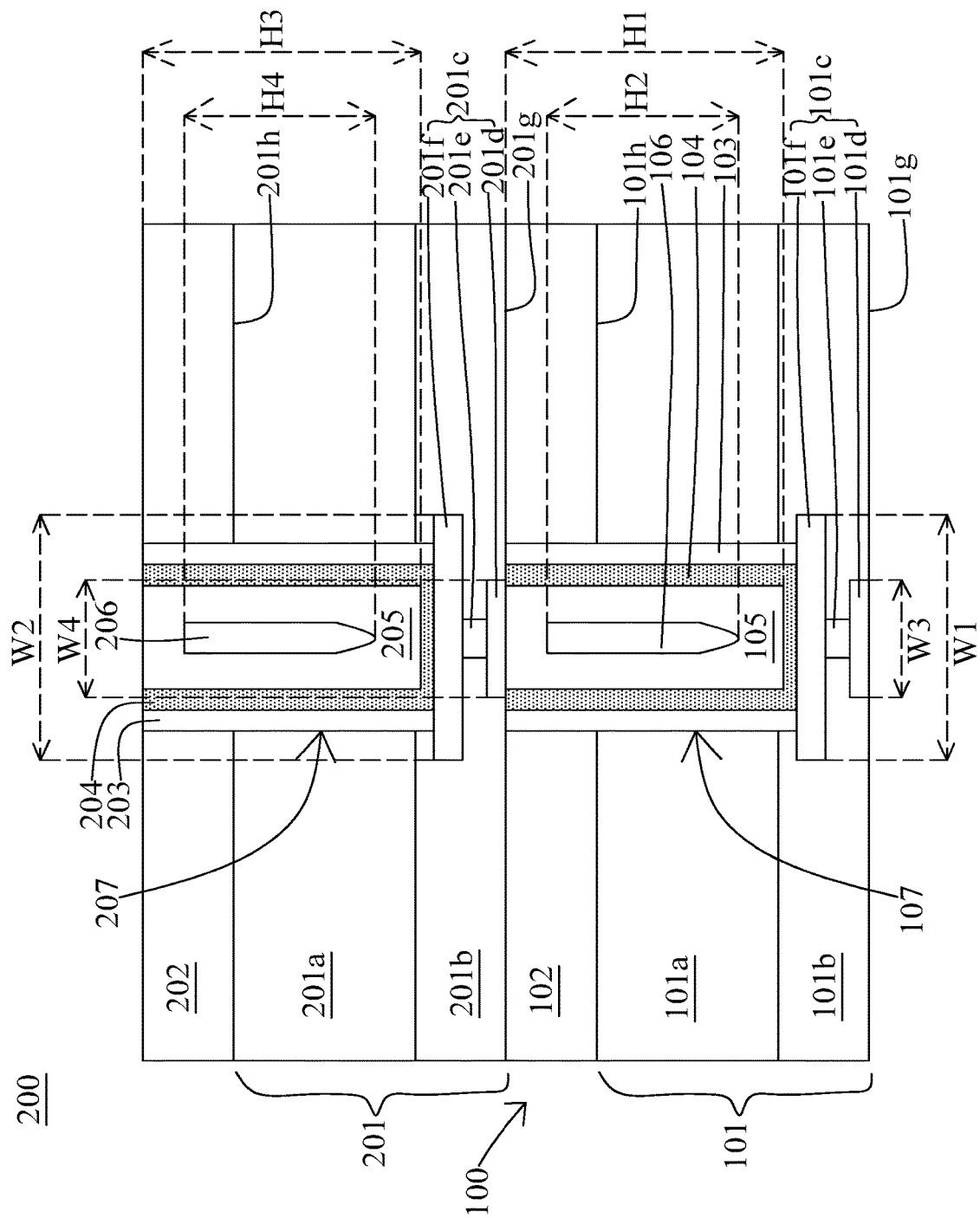
FIG. 2 is a cross-sectional view of a second semiconductor structure in accordance with some embodiments of the present disclosure.

FIG. 2 is a schematic cross-sectional view of a second semiconductor structure 200 in accordance with some embodiments of the present disclosure. In some embodiments, the second semiconductor structure 200 includes the first semiconductor structure 100 of FIG. 1. In some embodiments, a semiconductor structure similar to the first semiconductor structure 100 is stacked on the first semiconductor structure 100 to form the second semiconductor structure 200 as shown in FIG. 2.

In some embodiments, a second wafer 201 is disposed over the first semiconductor structure 100. In some embodiments, the second wafer 201 has a configuration similar to that of the first wafer 101. In some embodiments, a thickness of the second wafer 201 is substantially equal to a thickness of the first wafer 101.

In some embodiments, the second wafer 201 includes a second dielectric layer 201b bonded over the first passivation layer 102, a second substrate 201a over the second dielectric layer 201b, and a second interconnect structure 201c surrounded by the second dielectric layer 201b. In some embodiments, the second substrate 201a, the second dielectric layer 201b and the second interconnect structure 201c have configurations similar to those of the first substrate 101a, the first dielectric layer 101b and the first interconnect structure 101c, respectively. In some embodiments, the second dielectric layer 201b is bonded to the first passivation layer 102. In some embodiments, the second dielectric layer 201b is in contact with the first conductive via 105.

In some embodiments, the second interconnect structure 201c includes a second conductive pad 201f, a fourth conductive pad 201d and a second via 201e between the second conductive pad 201f and the fourth conductive pad 201d. In some embodiments, the second conductive pad 201f, the fourth conductive pad 201d and the second via 201e have configurations similar to those of the first conductive pad 101f, the third conductive pad 101d and the first via 101e, respectively. In some embodiments, the fourth conductive pad 201d is under the second conductive pad 201f.

In some embodiments, the second conductive pad 201f is vertically aligned with the first conductive pad 101f. In some embodiments, a width W2 of the second conductive pad 201f is substantially greater than a width W4 of the fourth conductive pad 201d. In some embodiments, the fourth conductive pad 201d is electrically connected to the second conductive pad 201f through the second via 201e and at least partially exposed through the second dielectric layer 201b. In some embodiments, the fourth conductive pad 201d is bonded to and in contact with the first conductive via 105.

In some embodiments, a second passivation layer 202 is disposed over the second substrate 201a. In some embodiments, the second passivation layer 202 has a configuration similar to that of the first passivation layer 102. In some embodiments, a second conductive via 205 extends from the second conductive pad 201f through the second substrate 201a and the second passivation layer 202 and partially through the second dielectric layer 201b.

In some embodiments, the second conductive via 205 is electrically connected to the first conductive via 105 through the second conductive pad 201f and the fourth conductive pad 201d. In some embodiments, the second conductive pad 201f and the fourth conductive pad 201d are disposed between the first conductive via 105 and the second conductive via 205. In some embodiments, the second conductive via 205 is vertically aligned with the first conductive via 105.

In some embodiments, a second elastic member 206 is disposed within the second conductive via 205. In some embodiments, the second elastic member 206 has a configuration similar to that of the first elastic member 106. In some embodiments, the second elastic member 206 is vertically aligned with the first elastic member 106. In some embodiments, a height H3 of the second conductive via 205 is substantially greater than a height H4 of the second elastic member 206.

In some embodiments, a second opening 207 extends from the second conductive pad 201f through the second substrate 201a and the second passivation layer 202 and partially through the second dielectric layer 201b. In some embodiments, the second opening 207 is above the second interconnect structure 201c. In some embodiments, the second opening 207 has a configuration similar to that of the first opening 107.

In some embodiments, a second dielectric liner 203 is disposed conformal to the second opening 207 and surrounds the second conductive via 205. In some embodiments, the second dielectric liner 203 has a configuration similar to that of the first dielectric liner 103. In some embodiments, a second conductive barrier layer 204 is disposed between the second dielectric liner 203 and the second conductive via 205. In some embodiments, the second conductive barrier layer 204 has a configuration similar to that of the first conductive barrier layer 104.

Figure 3:
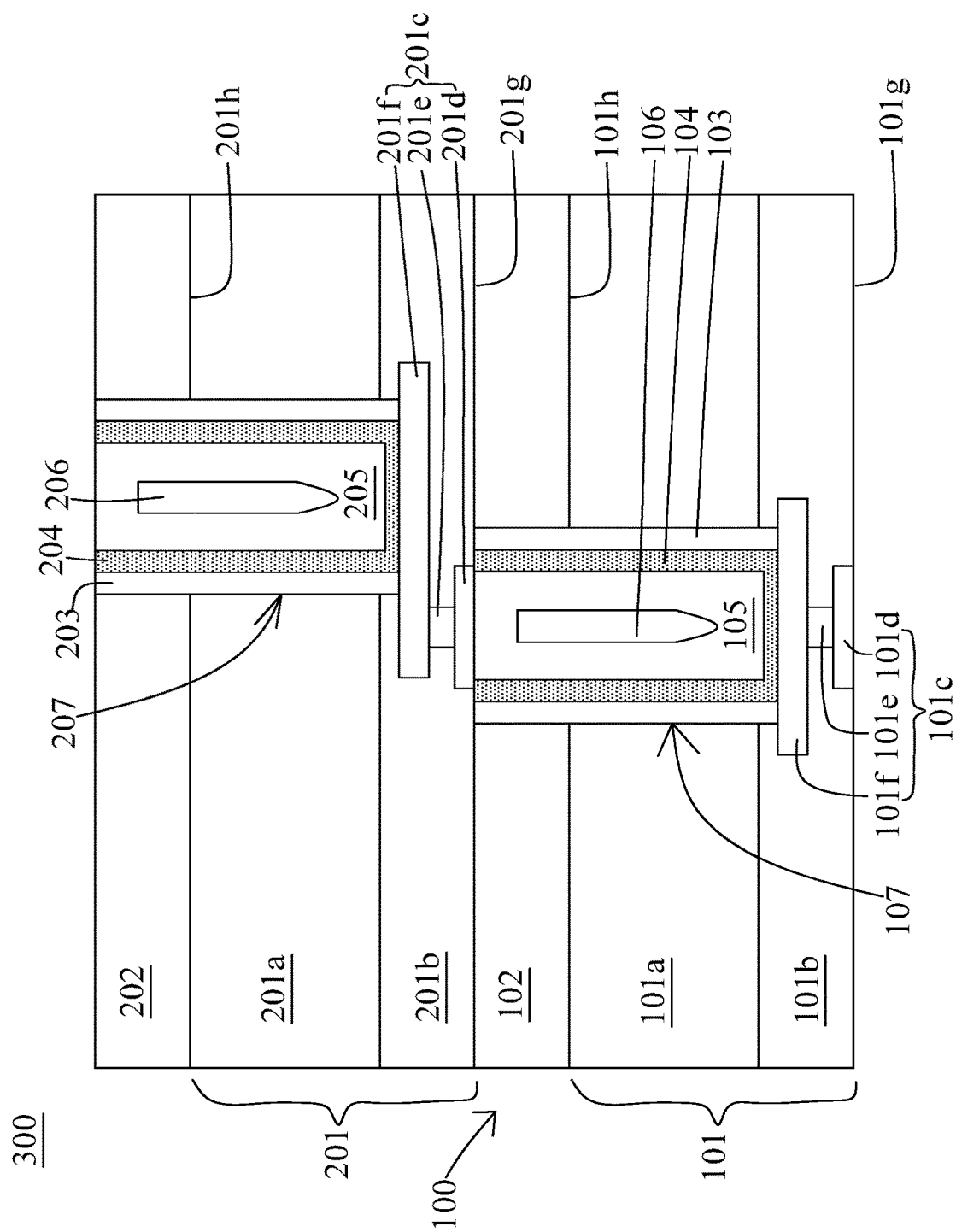
FIG. 3 is a cross-sectional view of a third semiconductor structure in accordance with some embodiments of the present disclosure.

FIG. 3 is a schematic cross-sectional view of a third semiconductor structure 300 in accordance with some embodiments of the present disclosure. In some embodiments, the third semiconductor structure 300 is similar to the second semiconductor structure 200, except the second conductive via 205 and the second elastic member 206 are laterally offset from the first conductive via 105 and the first elastic member 106. In some embodiments, the second conductive pad 201f is not vertically aligned with the first conductive pad 101f. In some embodiments, the second conductive via 205 does not overlap the first conductive via 105 from a top view. In some embodiments, a width of the first conductive pad 101f is substantially less than a width of the second conductive pad 201f.

Figure 4:
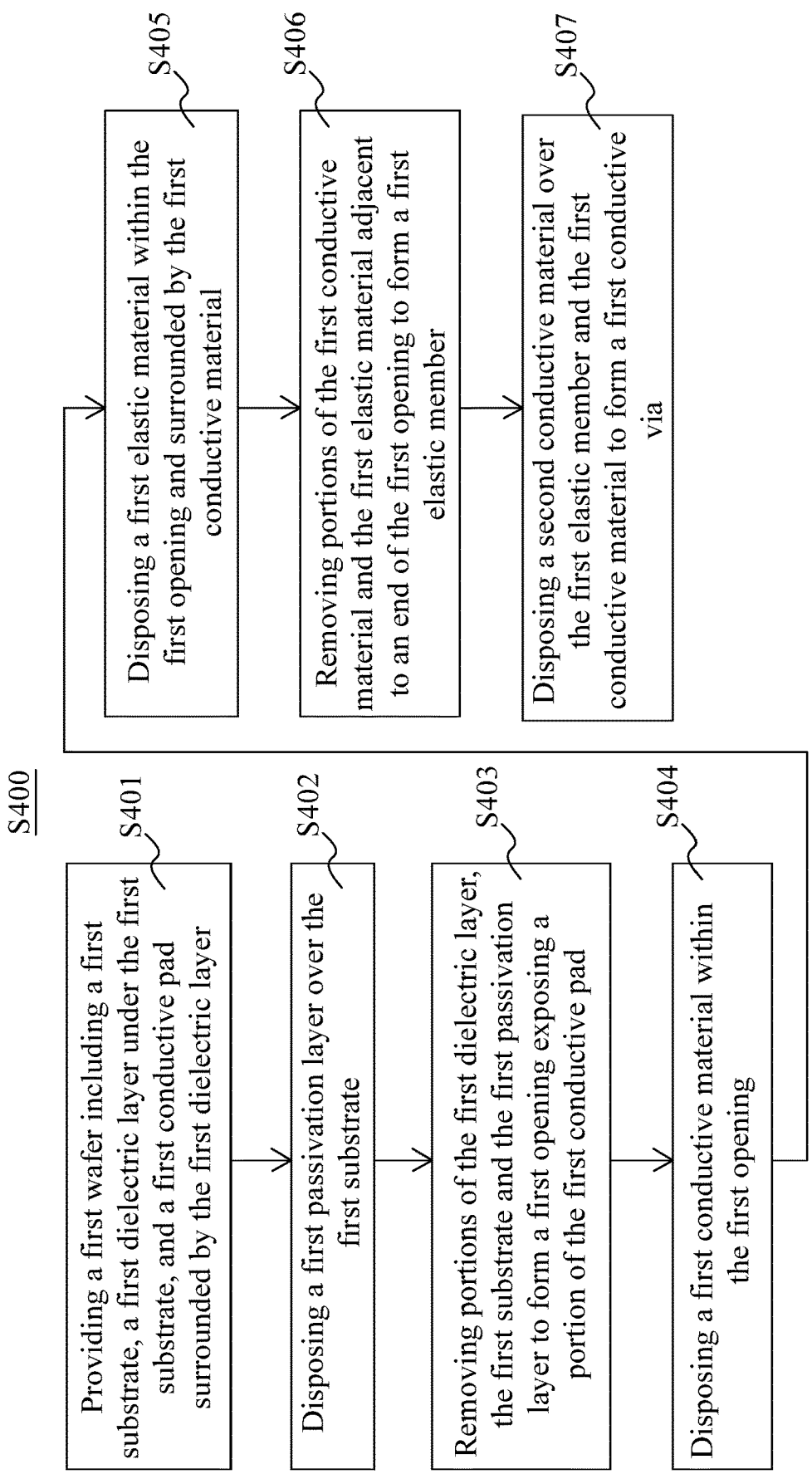
FIG. 4 is a flow diagram illustrating a method of manufacturing a semiconductor structure in accordance with some embodiments of the present disclosure.

FIG. 4 is a flow diagram illustrating a method S400 of manufacturing the first semiconductor structure 100 in accordance with some embodiments of the present disclosure, and FIGS. 5 to 17 illustrate cross-sectional views of intermediate stages in the formation of the first semiconductor structure 100 in accordance with some embodiments of the present disclosure.

The stages shown in FIGS. 5 to 17 are also illustrated schematically in the flow diagram in FIG. 4. In the following discussion, the fabrication stages shown in FIGS. 5 to 17 are discussed in reference to the process steps shown in FIG. 4. The method S400 includes a number of operations and the description and illustration are not deemed as a limitation to the sequence of the operations. The method S400 includes a number of steps (S401, S402, S403, S404, S405, S406 and S407).

Figure 5:
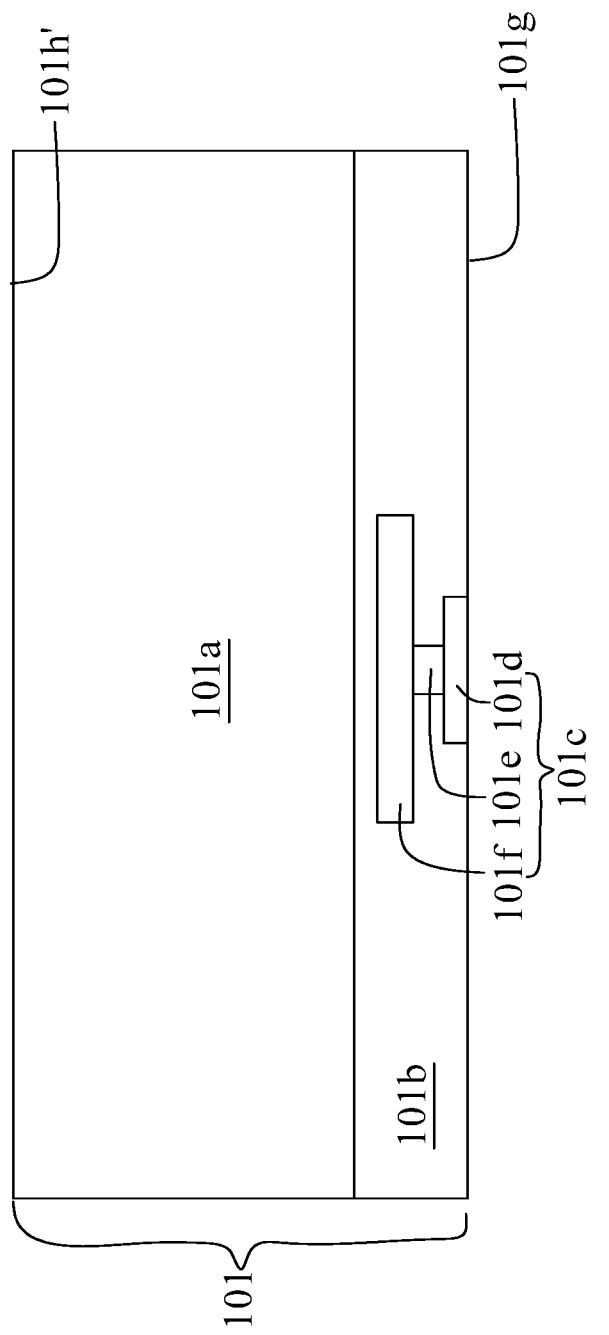
FIGS. 5 through 17 illustrate cross-sectional views of intermediate stages in the formation of a semiconductor structure in accordance with some embodiments of the present disclosure.

Referring to FIG. 5, a first wafer 101 is provided according to step S401 in FIG. 4. In some embodiments, the first wafer 101 includes a first substrate 101a, a first dielectric layer 101b under the first substrate 101a, and a first interconnect structure 101c surrounded by the first dielectric layer 101b. In some embodiments, the first substrate 101a is a semiconductive substrate. In some embodiments, the first dielectric layer 101b is formed under the first substrate 101a by deposition, chemical vapor deposition (CVD) or another suitable operation.

In some embodiments, the first interconnect structure 101c includes a first conductive pad 101f, a third conductive pad 101d and a first via 101e between the first conductive pad 101f and the third conductive pad 101d. In some embodiments, the first conductive pad 101f is formed by removing a portion of the first dielectric layer 101b to form a recess and disposing a conductive material to fill the recess to form the first conductive pad 101f. In some embodiments, the conductive material is disposed by electroplating, sputtering or another suitable operation. In some embodiments, the third conductive pad 101d is formed under the first conductive pad 101f, electrically connected to the first conductive pad 101f, and at least partially exposed through the first dielectric layer 101b.

Figure 6:
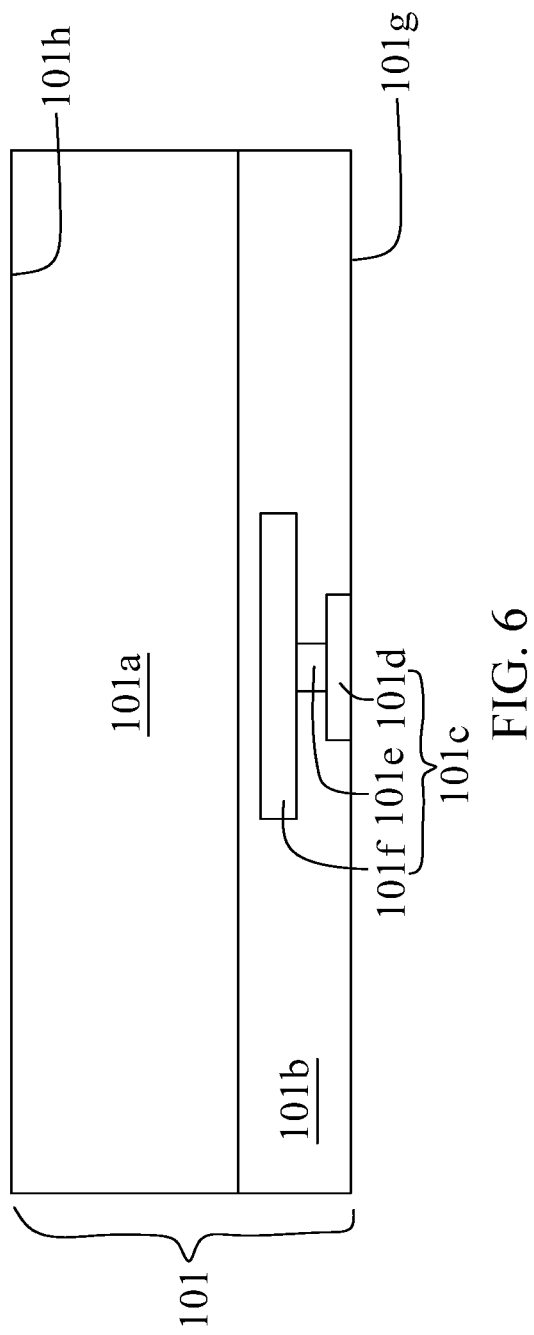

In some embodiments, the first wafer 101, the first substrate 101a, the first dielectric layer 101b, the first interconnect structure 101c, the first conductive pad 101f, the third conductive pad 101d and the first via 101e have configurations similar to those described above or illustrated in FIG. 1. In some embodiments, the first wafer 101 has a first surface 101g and a second untreated surface 101h' opposite to the first surface 101g. In some embodiments, the second untreated surface 101h' becomes a second surface 101h after grinding of the first substrate 101a as shown in FIG. 6, so that a thickness of the first substrate 101a is reduced. In some embodiments, the thickness of the first substrate 101a is reduced by grinding, etching, chemical mechanical planarization (CMP) or another suitable operation.

Figure 7:
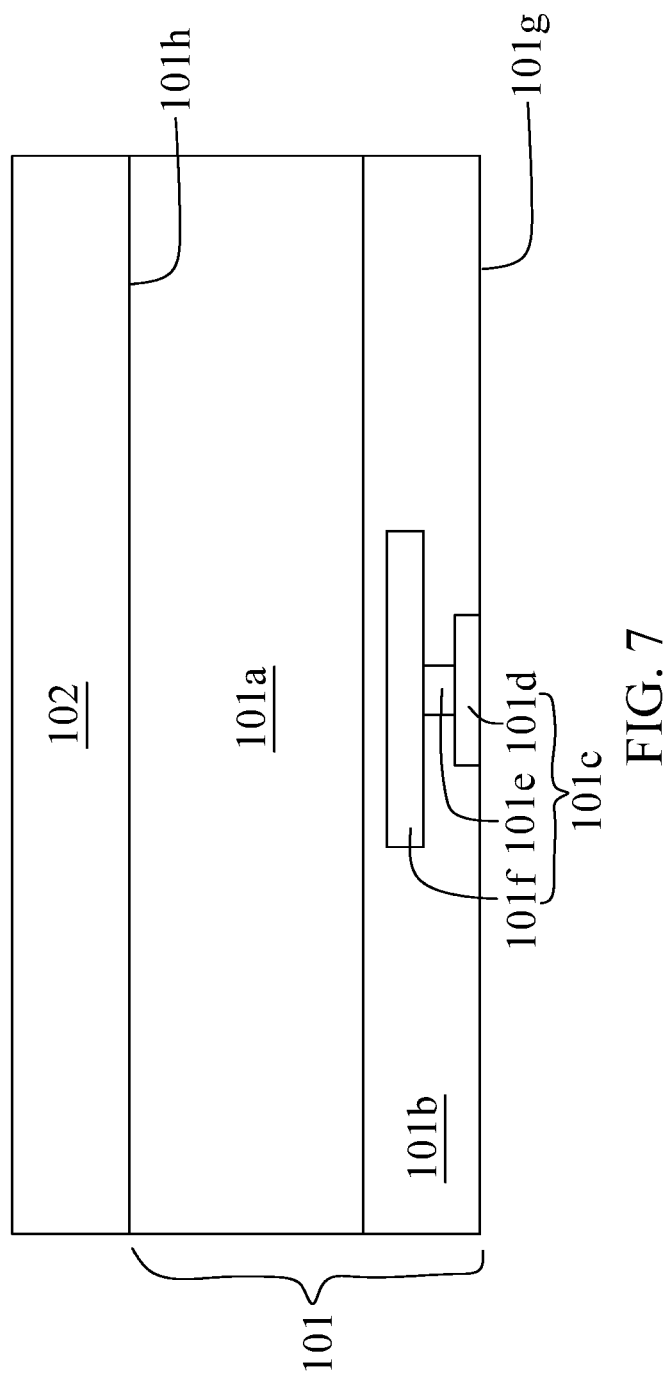

Referring to FIG. 7, a first passivation layer 102 is disposed over the first substrate 101a according to step S402 in FIG. 4. In some embodiments, the grinding of the first substrate 101a as shown in FIG. 6 is performed prior to the disposing of the first passivation layer 102. In some embodiments, the first passivation layer 102 is formed by deposition, CVD or another suitable operation. In some embodiments, the first passivation layer 102 has a configuration similar to that described above or illustrated in FIG. 1.

Figure 8:
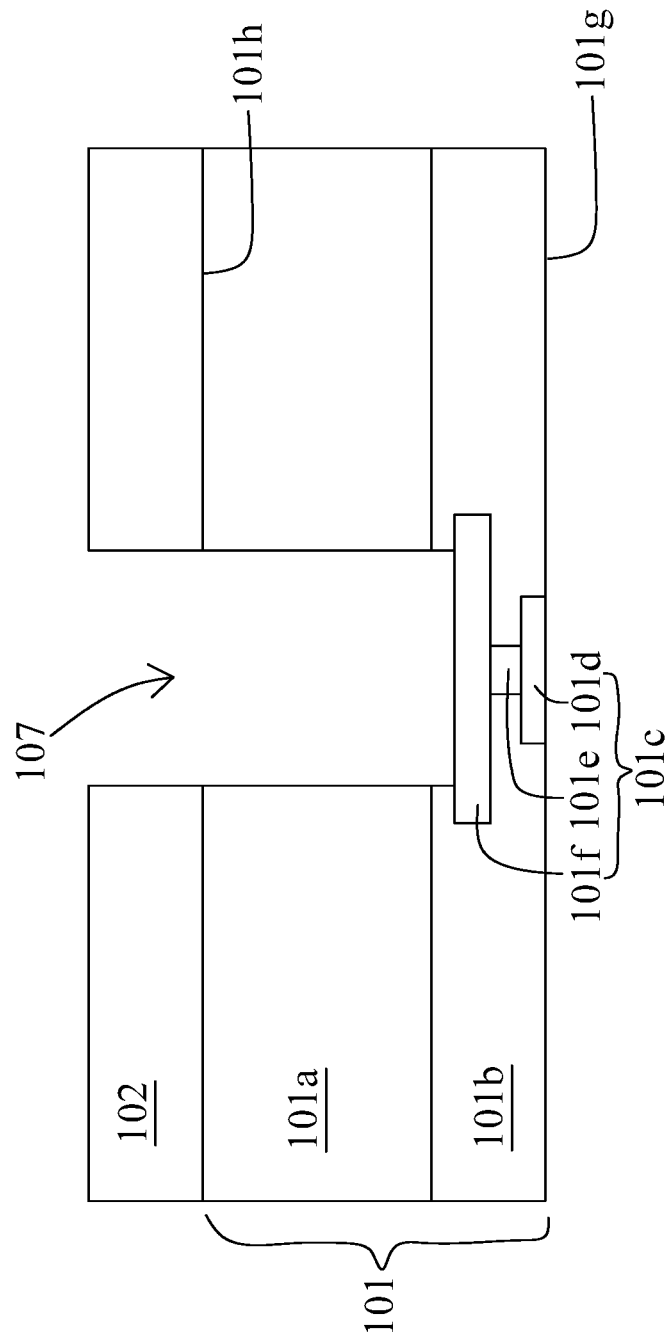

Referring to FIG. 8, portions of the first dielectric layer 101b, the first substrate 101a and the first passivation layer 102 are removed to form a first opening 107 according to step S403 in FIG. 4. In some embodiments, the first opening 107 exposes a portion of the first conductive pad 101f. In some embodiments, the portions of the first dielectric layer 101b, the first substrate 101a and the first passivation layer 102 are removed by etching or any other suitable process. In some embodiments, the first opening 107 has a configuration similar to that described above or illustrated in FIG. 1.

Figure 9:
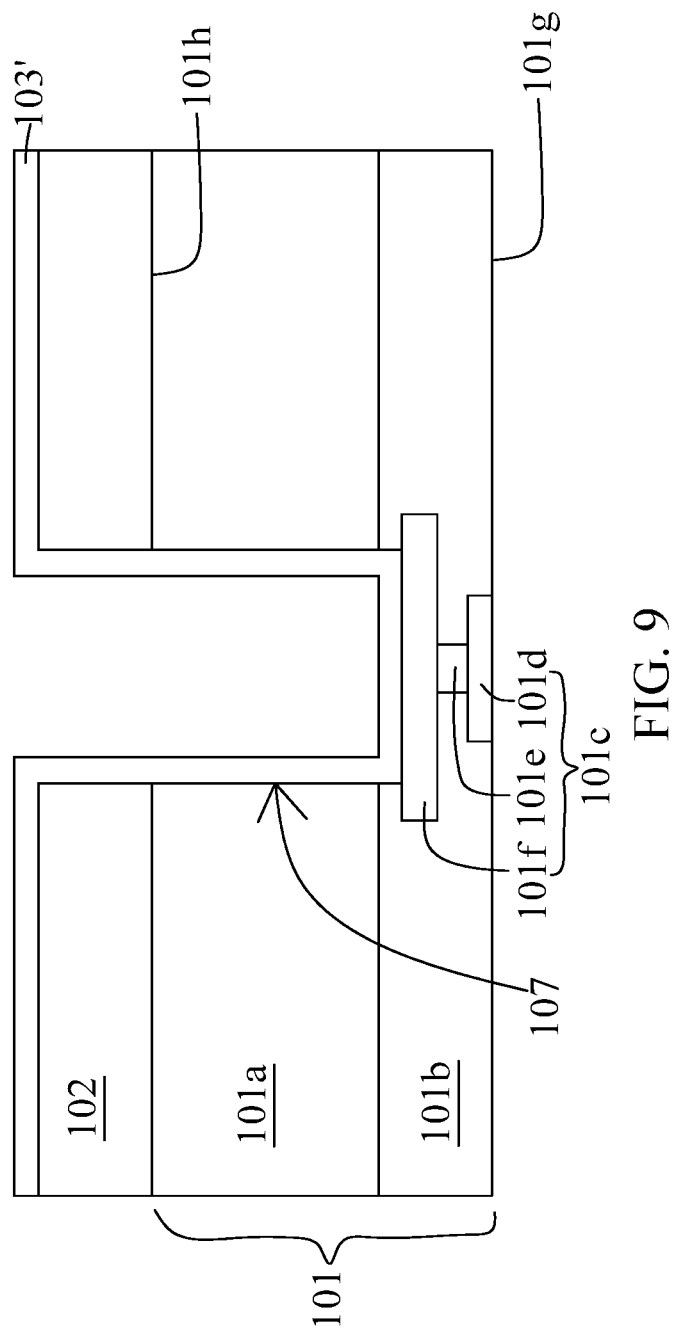
Figure 10:
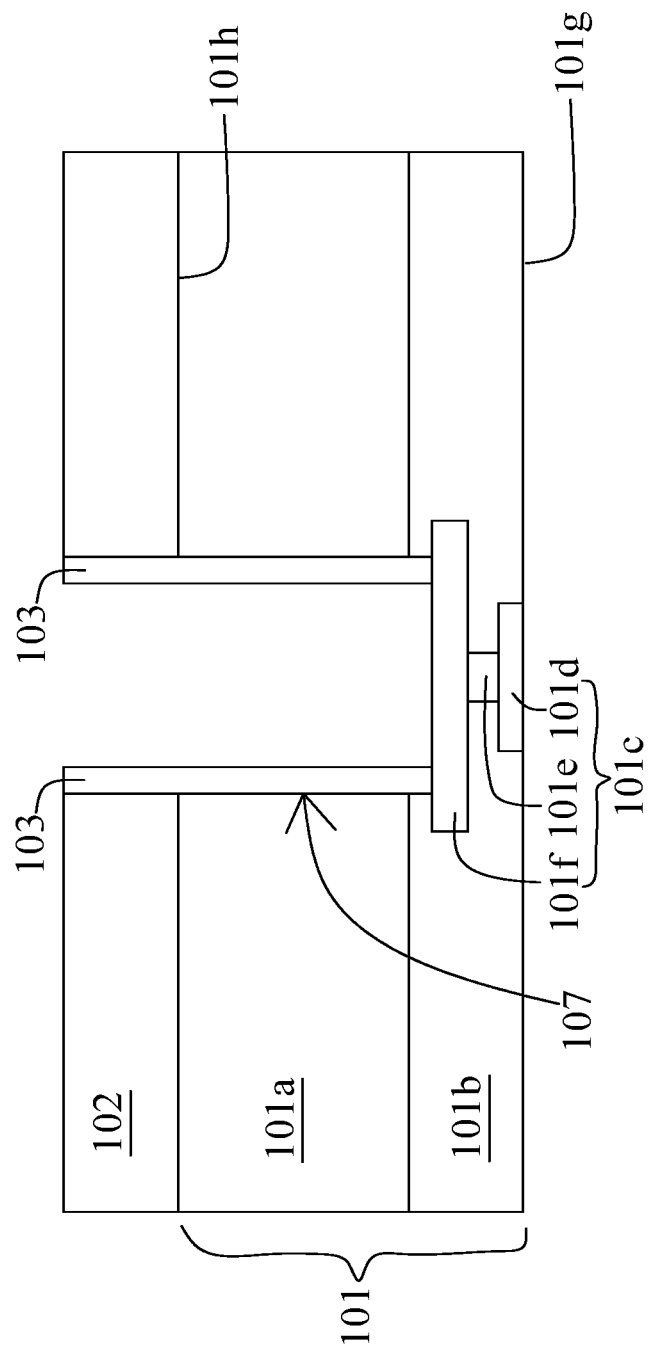

In some embodiments, a first dielectric liner 103 is formed within the first opening 107 as shown in FIGS. 9 and 10. In some embodiments, the first dielectric liner 103 is formed by disposing a dielectric liner material 103' over the first passivation layer 102 and the first conductive pad 101f and within the first opening 107 as shown in FIG. 9, and then removing the dielectric liner material 103' over the first passivation layer 102 and the first conductive pad 101f to form the first dielectric liner 103 as shown in FIG. 10. In some embodiments, the dielectric liner material 103' is disposed by deposition, atomic layer deposition (ALD), CVD or another suitable process. In some embodiments, the dielectric liner material 103' includes oxide or the like. In some embodiments, the first conductive pad 101f is at least partially exposed through the first dielectric liner 103.

Figure 11:
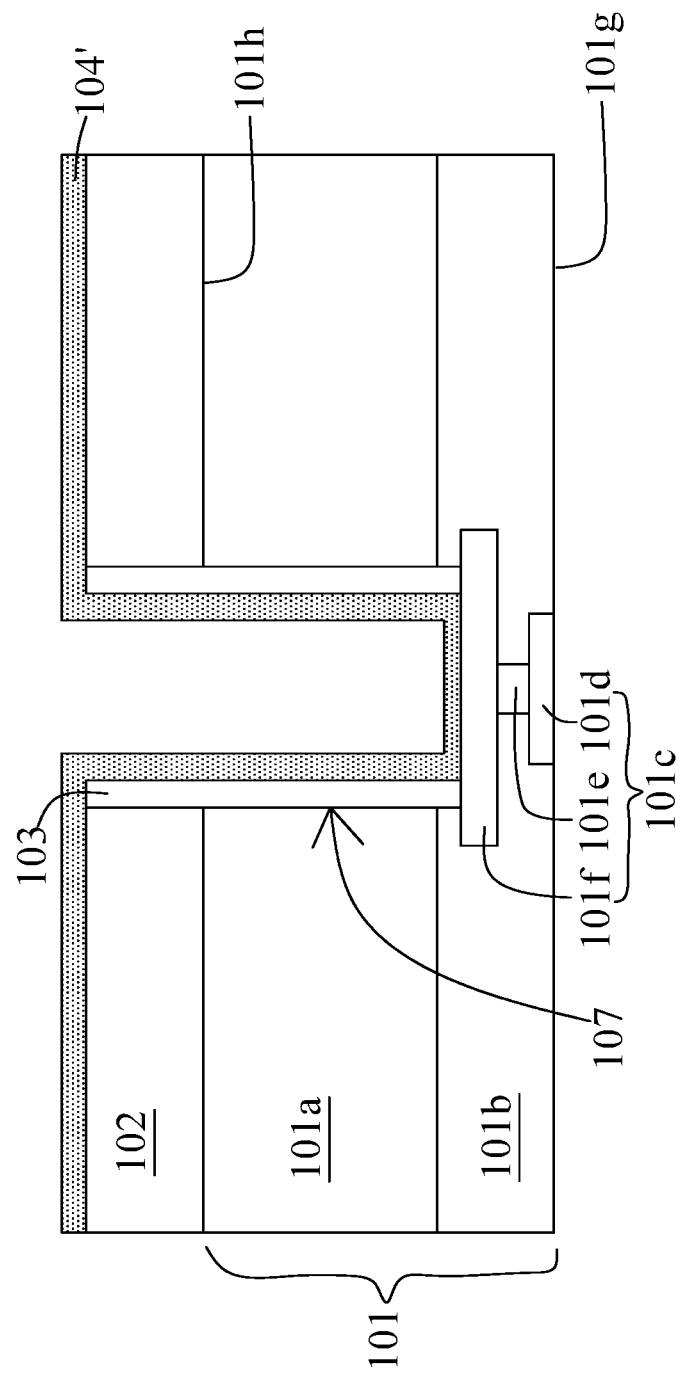

In some embodiments, a first conductive barrier layer material 104' is disposed over the first passivation layer 102, conformal to the first dielectric liner 103 and within the first opening 107 as shown in FIG. 11. In some embodiments, the first conductive barrier layer material 104' is disposed by ALD, CVD or the like. In some embodiments, the first conductive barrier layer material 104' includes titanium, titanium nitride, tantalum, tantalum nitride, nickel or the like.

In some embodiments, after the disposing of the first conductive barrier layer material 104', a seed layer is disposed over the first conductive barrier layer material 104'. In some embodiments, the seed layer is disposed by sputtering or another suitable operation. In some embodiments, the seed layer includes titanium, copper, nickel, gold or the like.

Figure 12:
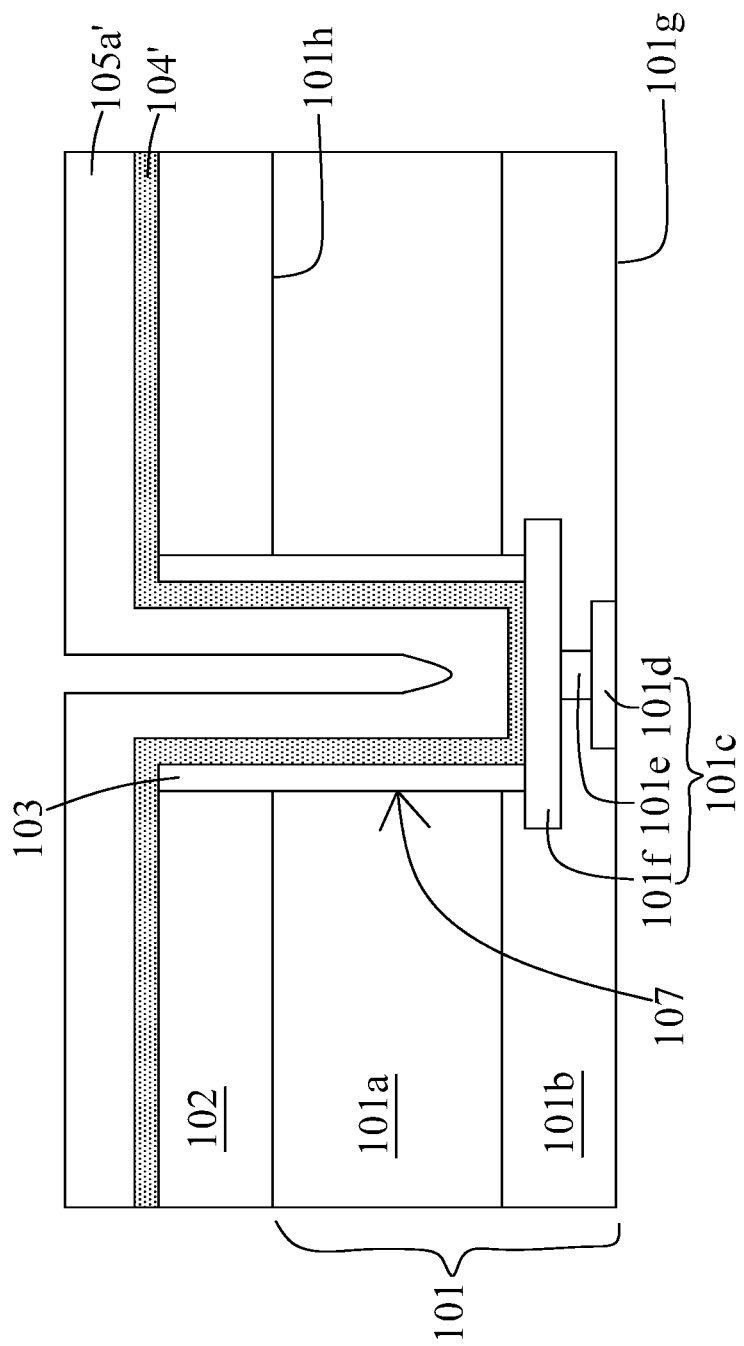

Referring to FIG. 12, a first conductive material 105a' is disposed within the first opening 107 according to step S404 in FIG. 4. In some embodiments, the first conductive material 105a' is disposed conformal to the first conductive barrier layer material 104'. In some embodiments, the first conductive material 105a' is disposed by electroplating or another suitable operation. In some embodiments, the first conductive material 105a' includes gold, silver, copper, nickel, tungsten, aluminum, tin, alloys thereof or the like. In some embodiments, the disposing of the first dielectric liner 103 conformal to the first opening 107 is performed prior to the disposing of the first conductive material 105a'.

Figure 13:
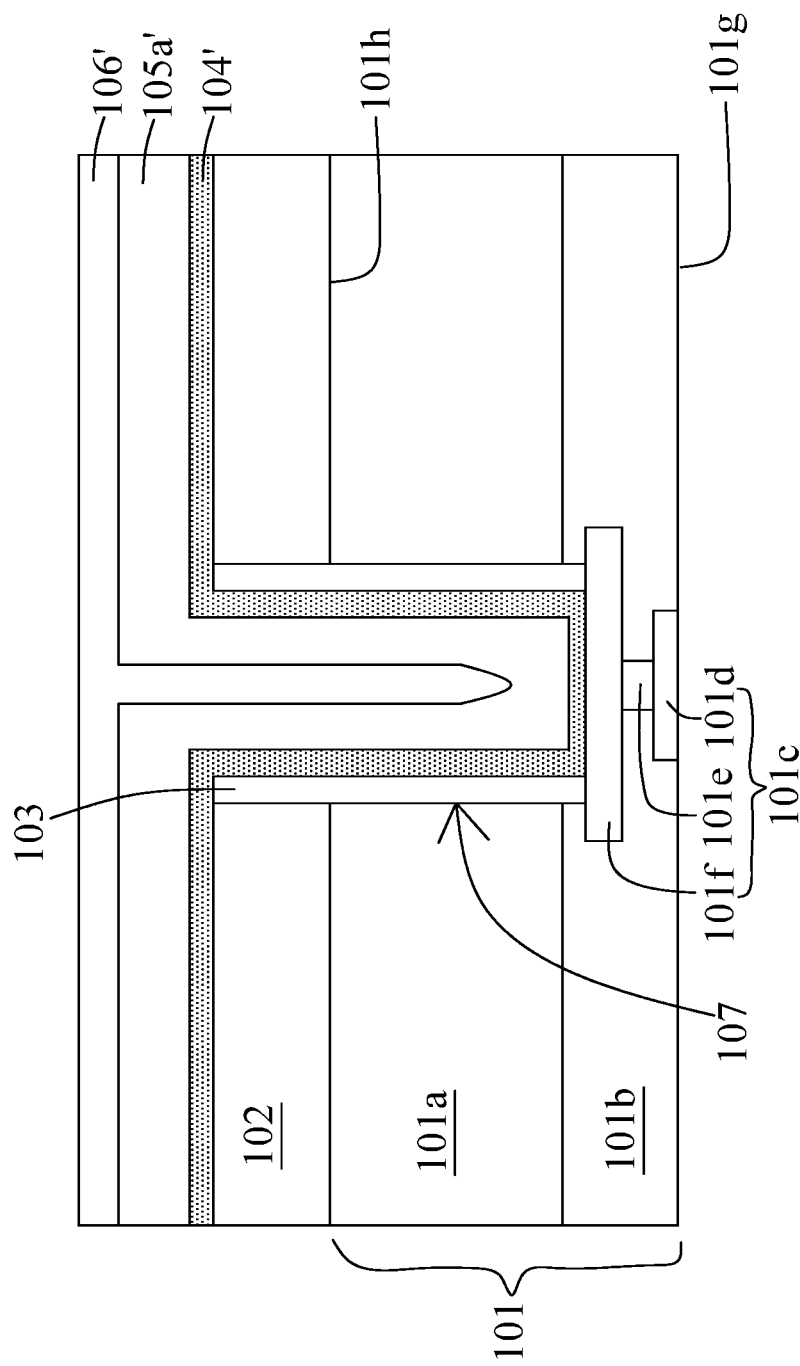

Referring to FIG. 13, a first elastic material 106' is disposed within the first opening 107 and surrounded by the first conductive material 105a' according to step S405 in FIG. 4. In some embodiments, the first elastic material 106' is disposed over and surrounded by the first conductive material 105a'. In some embodiments, the first elastic material 106' is disposed by deposition or any other suitable process. In some embodiments, the first elastic material 106' includes organic material. In some embodiments, the first elastic material 106' includes polymer, resin, epoxy or the like. In some embodiments, the first elastic material 106' is flexible and compressible.

Figure 14:
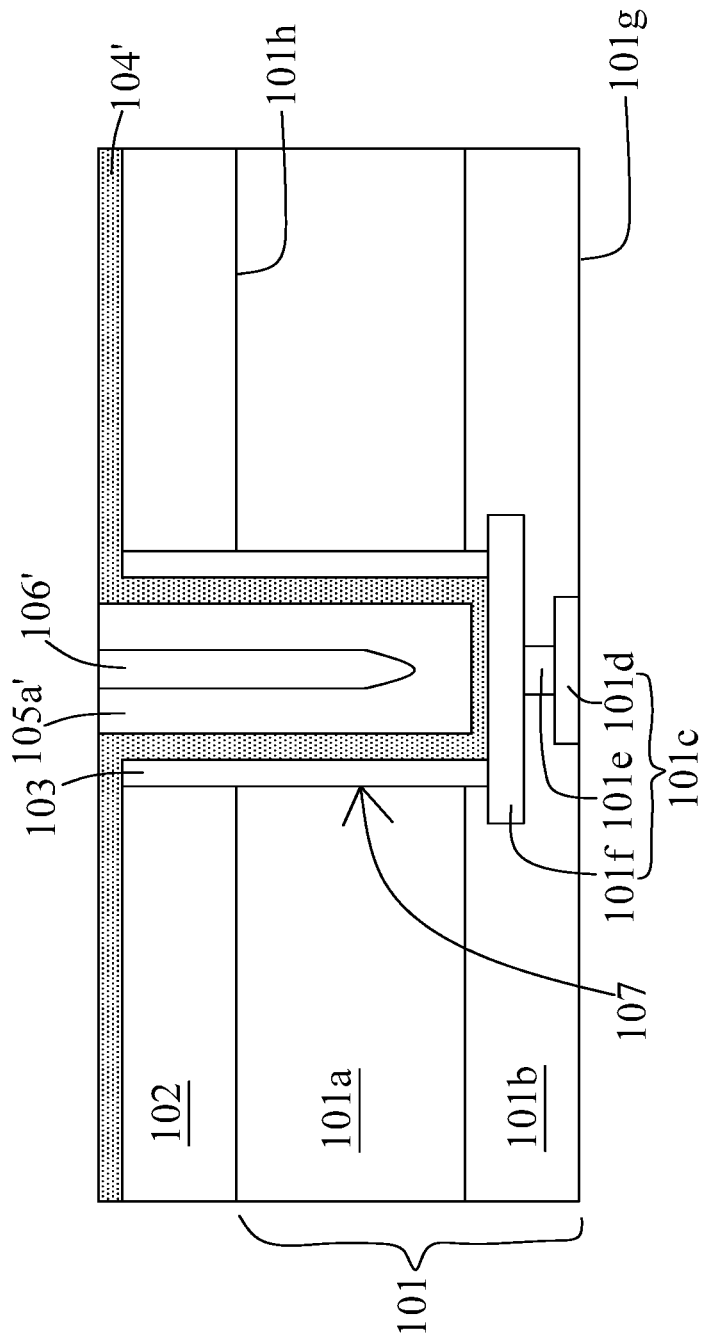

In some embodiments, after the disposing of the first conductive material 105a' and the first elastic material 106', portions of the first conductive material 105a' and the first elastic material 106' disposed over the first passivation layer 102 are removed as shown in FIG. 14. In some embodiments, the portions of the first conductive material 105a' and the first elastic material 106' disposed over the first passivation layer 102 are removed by planarization, chemical mechanical polishing (CMP), etching or any other suitable process. In some embodiments, the removal of the portions of the first conductive material 105a' and the first elastic material 106' disposed over the first passivation layer 102 is terminated when the first conductive barrier layer 104' is exposed.

Figure 15:
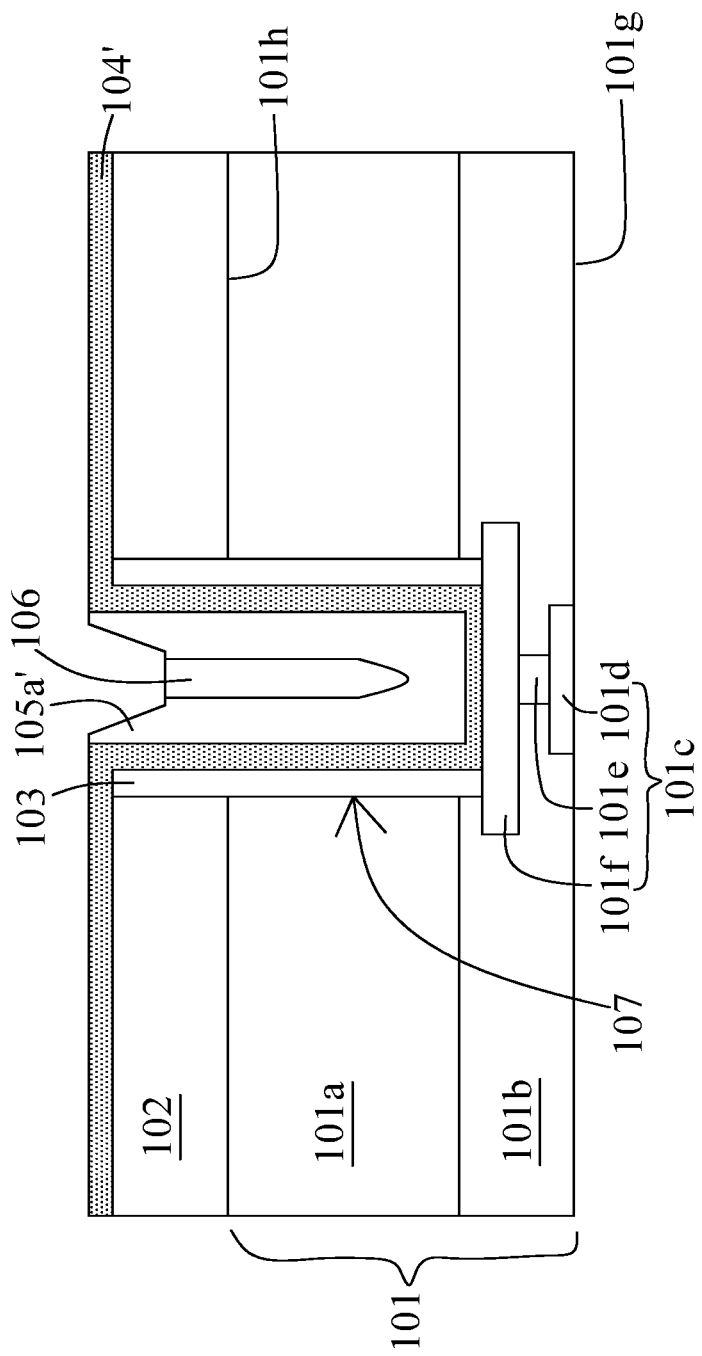

Referring to FIG. 15, portions of the first conductive material 105a' and the first elastic material 106' adjacent to an end of the first opening 107 are removed according to step S406 in FIG. 4. In some embodiments, a first elastic member 106 is formed after the removal of the portions of the first conductive material 105a' and the first elastic material 106' adjacent to an end of the first opening 107. In some embodiments, the portions of the first conductive material 105a' and the first elastic material 106' adjacent to an end of the first opening 107 are removed by an etch-back process or any other suitable process.

Figure 16:
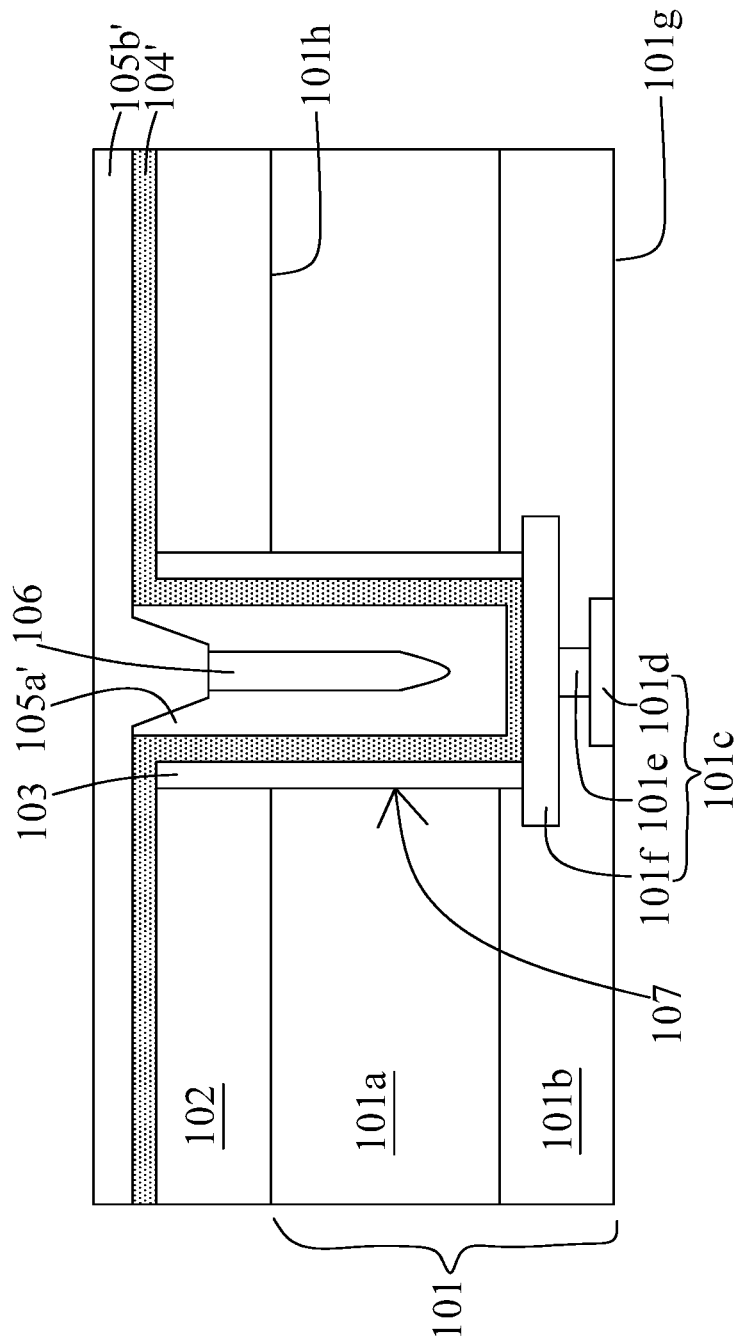
Figure 17:
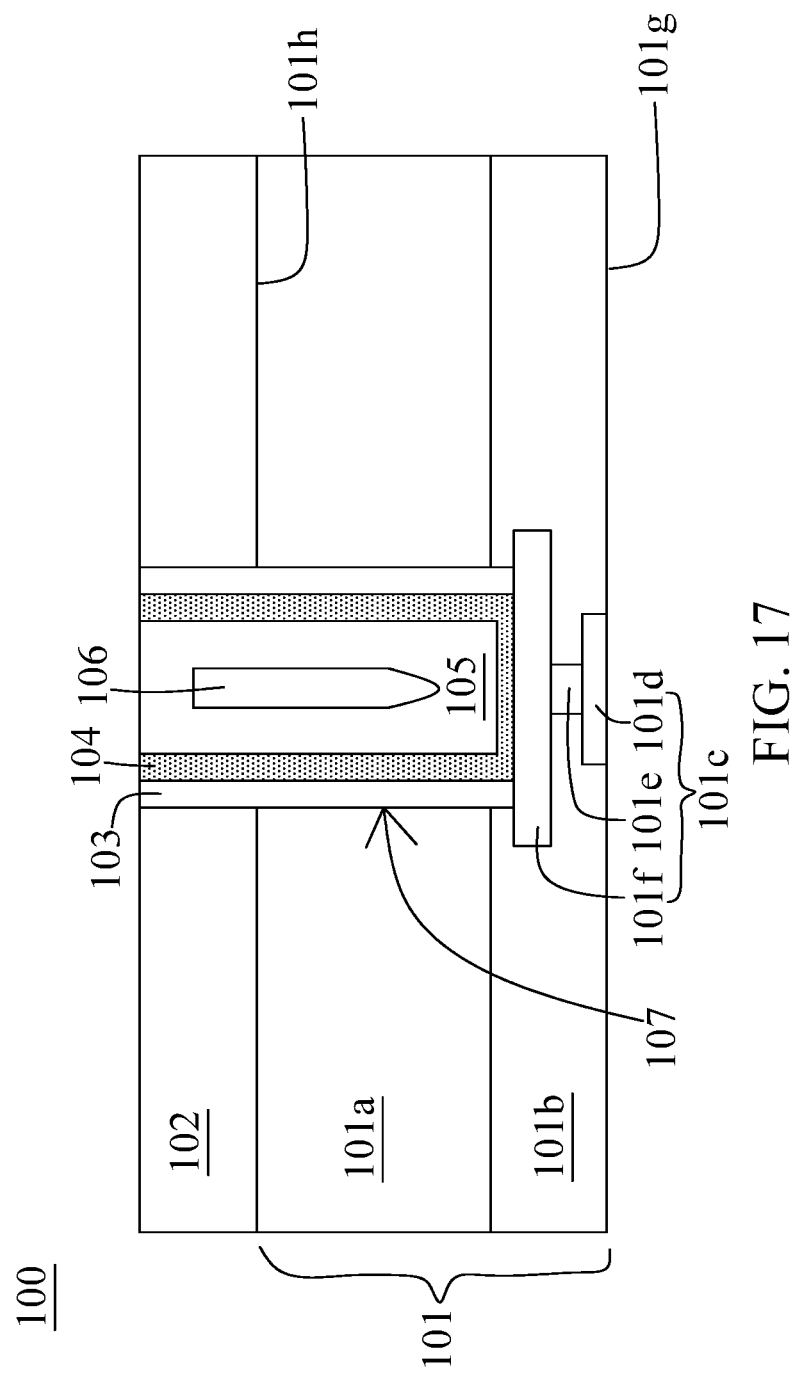

Referring to FIGS. 16 and 17, a second conductive material 105b' is disposed over the first elastic member 106 and the first conductive material 105a' according to step S407 in FIG. 4. In some embodiments, the second conductive material 105b' is disposed over the first passivation layer 102, the first elastic member 106 and the first conductive material 105a' and within the first opening 107 as shown in FIG. 16.

In some embodiments, the second conductive material 105b' is disposed by electroplating or another suitable operation. In some embodiments, the second conductive material 105b' includes gold, silver, copper, nickel, tungsten, aluminum, tin, alloys thereof or the like. In some embodiments, the first conductive material 105a' and the second conductive material 105b' include a same material.

In some embodiments, after the disposing of the second conductive material 105b' as shown in FIG. 16, the second conductive material 105b' over the first passivation layer 102 is removed by planarization, CMP, etching or any other suitable process as shown in FIG. 17. In some embodiments, the first conductive barrier layer material 104' over the first passivation layer 102 is also removed. In some embodiments, the first conductive via 105 surrounds the first elastic member 106. In some embodiments, the first conductive via 105 and the first elastic member 106 have configurations similar to those described above or illustrated in FIG. 1. In some embodiments, the first semiconductor structure 100 as shown in FIG. 1 is formed as shown in FIG. 17.

Figure 18:
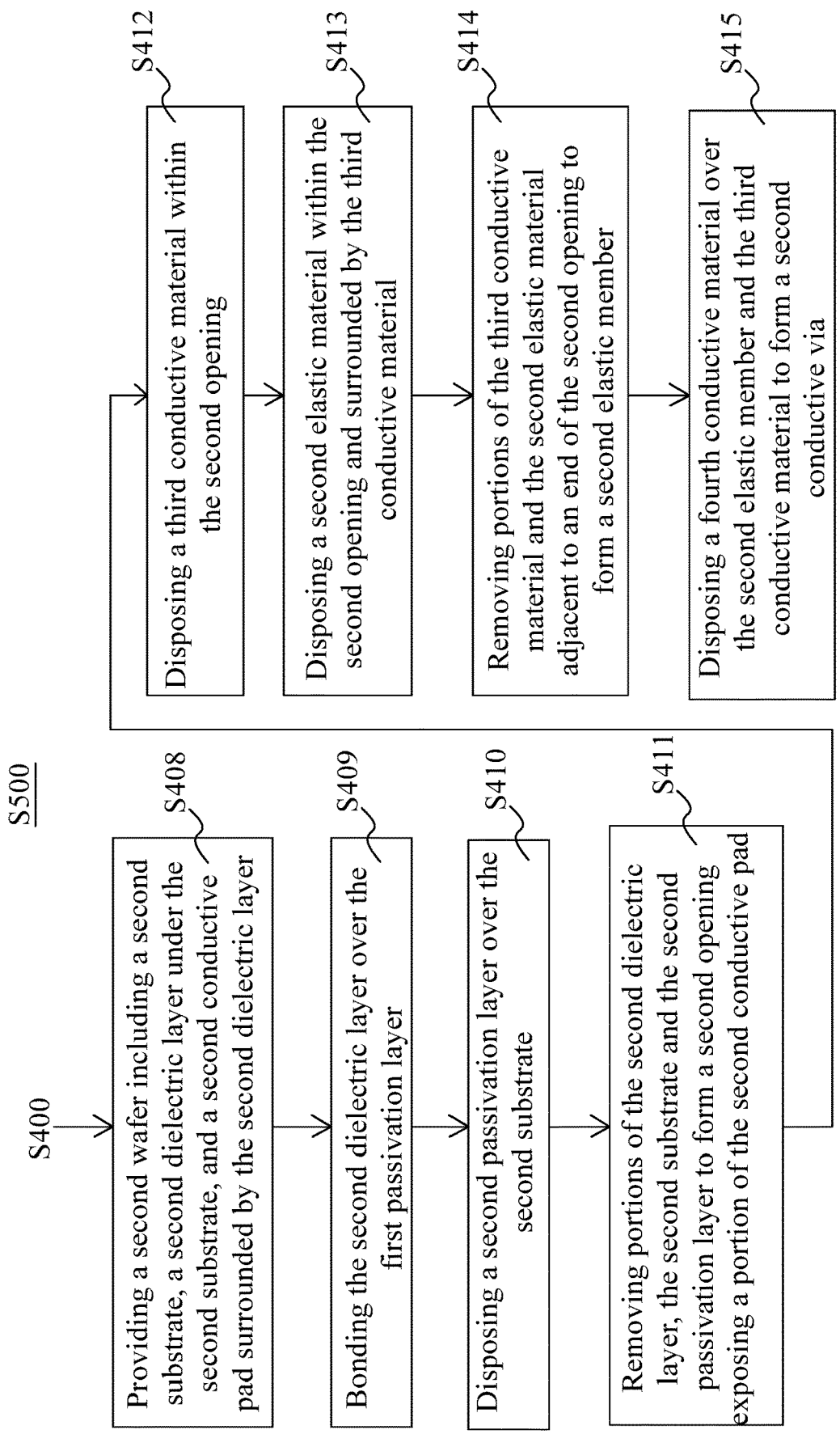
FIG. 18 is a flow diagram illustrating a method of manufacturing a semiconductor structure in accordance with some embodiments of the present disclosure.

FIG. 18 is a flow diagram illustrating a method S500 of manufacturing the second semiconductor structure 200 or the third semiconductor structure 300 in accordance with some embodiments of the present disclosure, and FIGS. 19 to 28 illustrate cross-sectional views of intermediate stages in the formation of the second semiconductor structure 200 or the third semiconductor structure 300 in accordance with some embodiments of the present disclosure.

The stages shown in FIGS. 19 to 28 are also illustrated schematically in the flow diagram in FIG. 18. In the following discussion, the fabrication stages shown in FIGS. 19 to 28 are discussed in reference to the process steps shown in FIG. 18. The method S500 includes a number of operations and the description and illustration are not deemed as a limitation to the sequence of the operations. The method S500 includes a number of steps (S401, S402, S403, S404, S405, S406, S407, S408, S409, S410, S411, S412, S413, S414 and S415). The steps S401 to S407 of the method S400 are shown in the flow diagram in FIG. 4 and described above with reference to FIGS. 5 to 17; repeated descriptions of such steps are omitted. In some embodiments, after completion of the method S400, the steps S408 to S415 are implemented.

Figure 19:
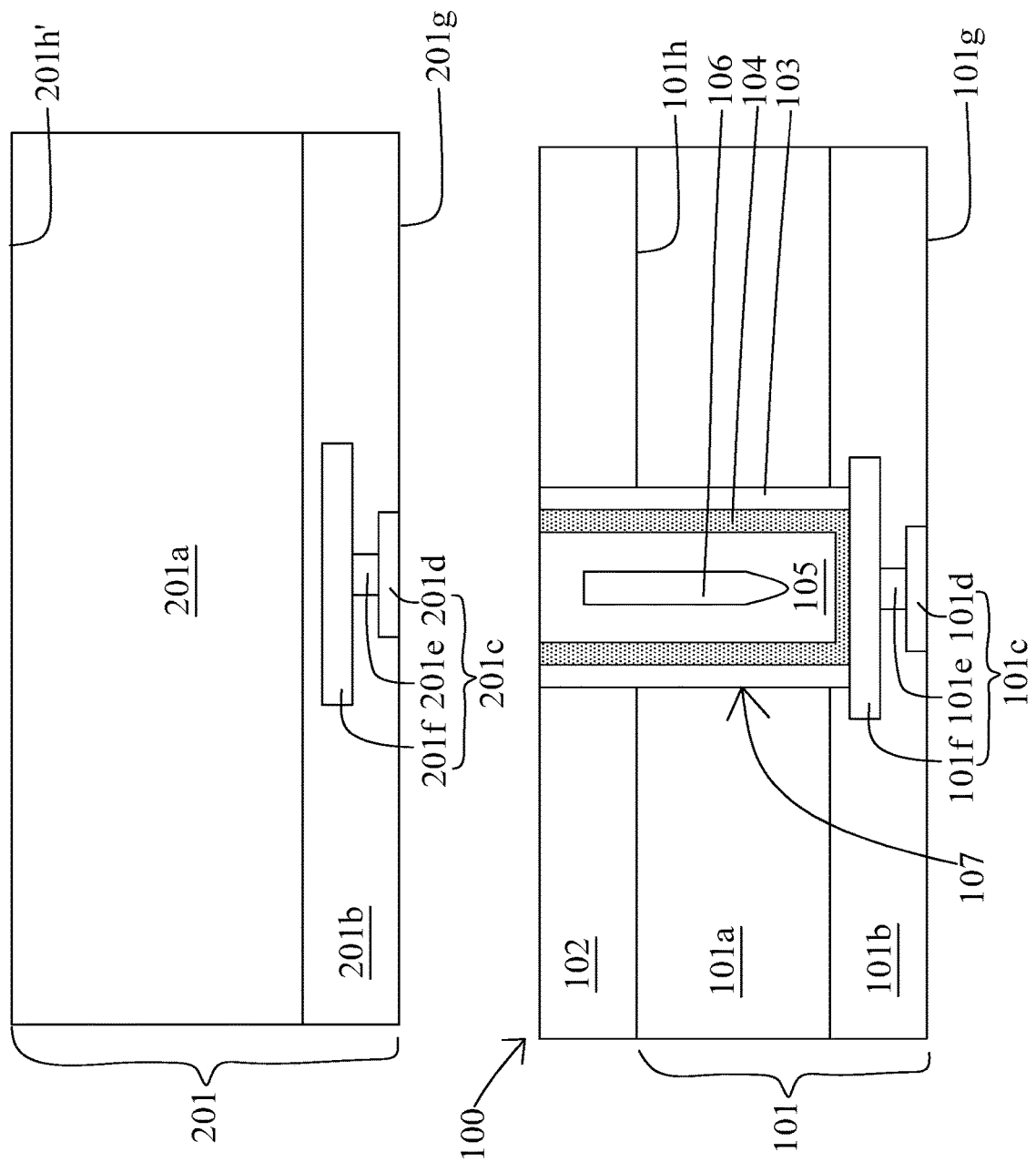
FIGS. 19 through 28 illustrate cross-sectional views of intermediate stages in the formation of a semiconductor structure in accordance with some embodiments of the present disclosure.

Referring to FIG. 19, a second wafer 201 is provided according to step S408 in FIG. 18. In some embodiments, the step S408 is similar to the step S401. In some embodiments, the second wafer 201 includes a second substrate 201a, a second dielectric layer 201b under the second substrate 201a, and a second interconnect structure 201c surrounded by the second dielectric layer 201b. In some embodiments, the second interconnect structure 201c includes a second conductive pad 201f, a fourth conductive pad 201d and a second via 201e between the second conductive pad 201f and the fourth conductive pad 201d.

In some embodiments, the fourth conductive pad 201d is formed under the second conductive pad 201f, wherein the fourth conductive pad 201d is electrically connected to the second conductive pad 201f and at least partially exposed through the second dielectric layer 201b. In some embodiments, a width of the second conductive pad 201f is substantially greater than a width of the fourth conductive pad 201d.

Figure 20:
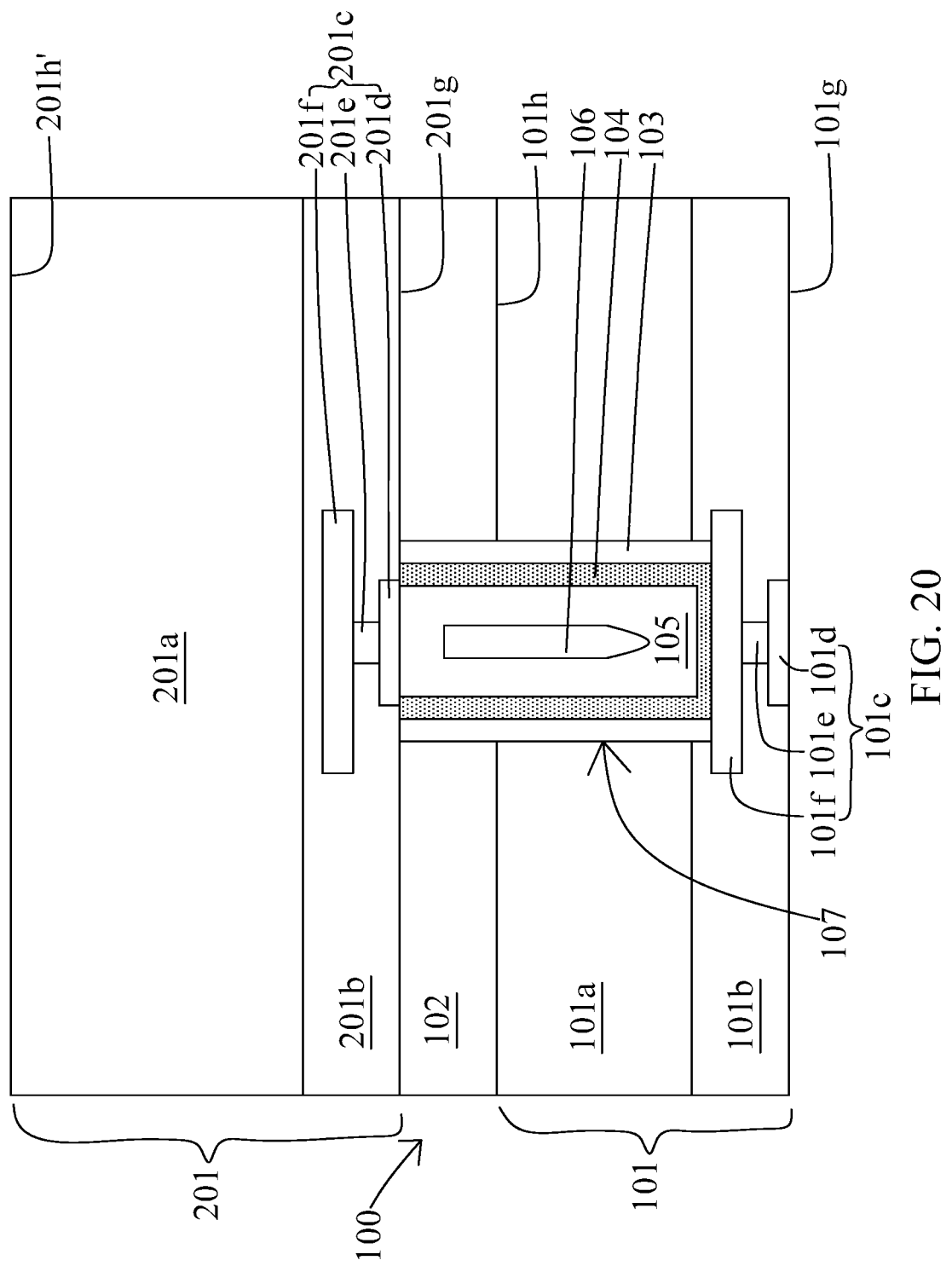

Referring to FIG. 20, the second dielectric layer 201b is bonded over the first passivation layer 102 according to step S409 in FIG. 18. In some embodiments, the bonding of the second dielectric layer 201b over the first passivation layer 102 is implemented after the formation of the first conductive via 105 and the first elastic member 106. In some embodiments, the first passivation layer 102 is bonded to the second dielectric layer 201b, and the first conductive via 105 is bonded to the fourth conductive pad 201d. In some embodiments, the first wafer 101 and the second wafer 102 are bonded by an oxide-to-oxide bonding technique or another suitable operation.

Figure 21:
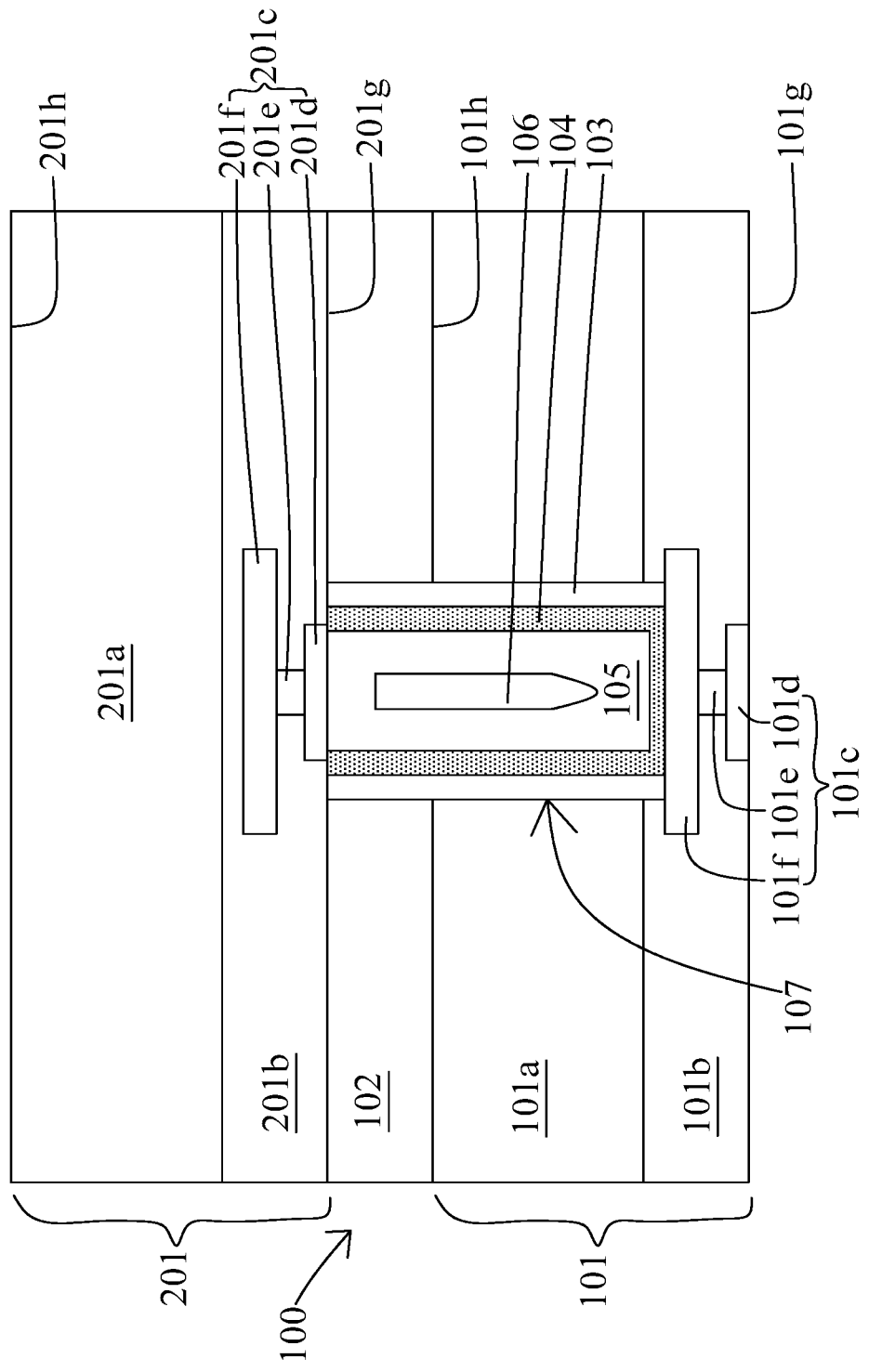

In some embodiments, the second wafer 201 has a third surface 201g and a fourth untreated surface 201h' opposite to the third surface 201g. In some embodiments, the fourth untreated surface 201h' becomes a fourth surface 201h after grinding of the second substrate 201a as shown in FIG. 21, so that a thickness of the second substrate 201a is reduced. In some embodiments, the thickness of the second substrate 201a is reduced after the bonding of the first passivation layer 102 to the second dielectric layer 201b.

Figure 22:
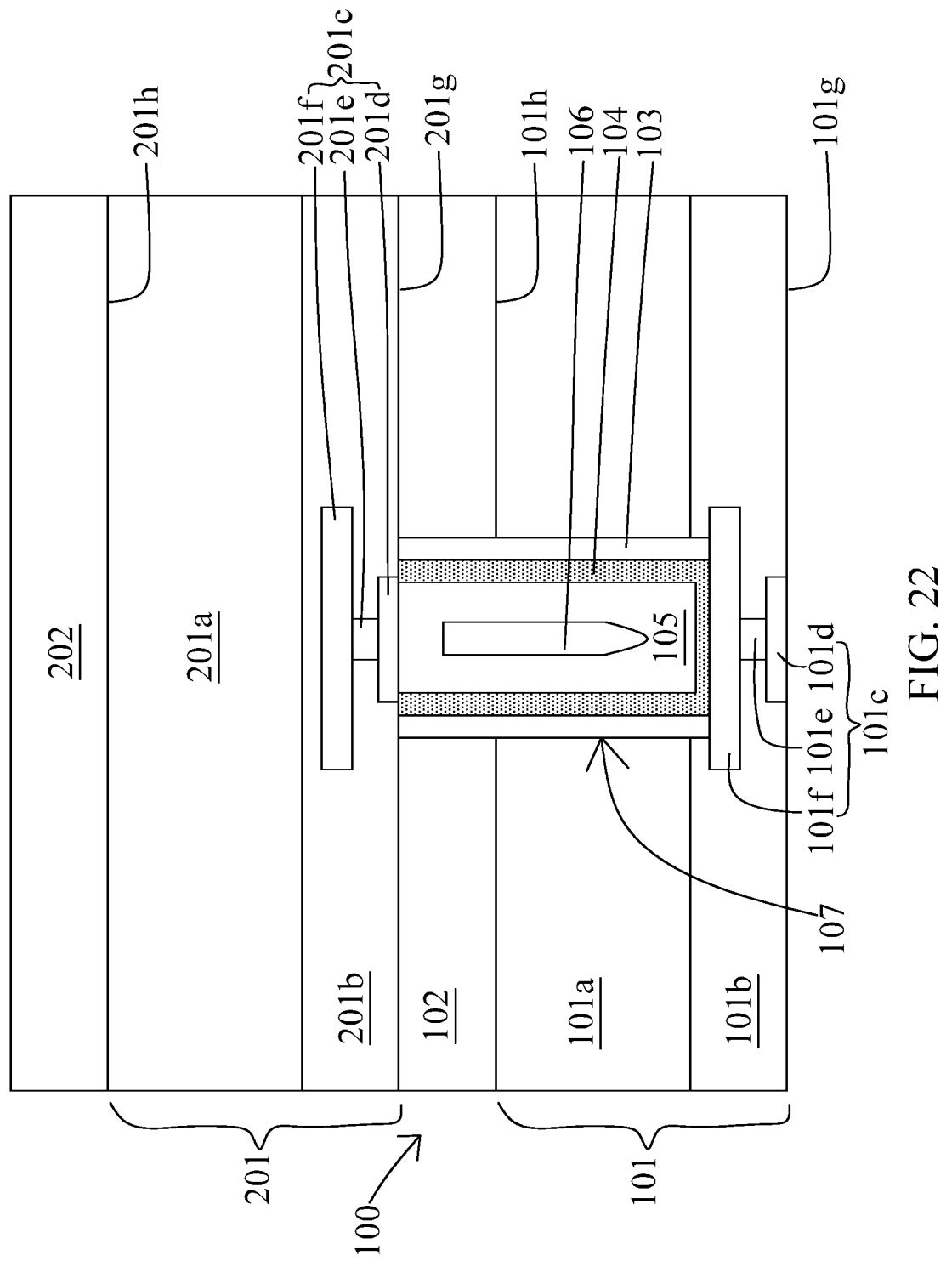

Referring to FIG. 22, a second passivation layer 202 is disposed over the second substrate 201a according to step S410 in FIG. 18. In some embodiments, the step S410 is similar to the step S402.

Figure 23:
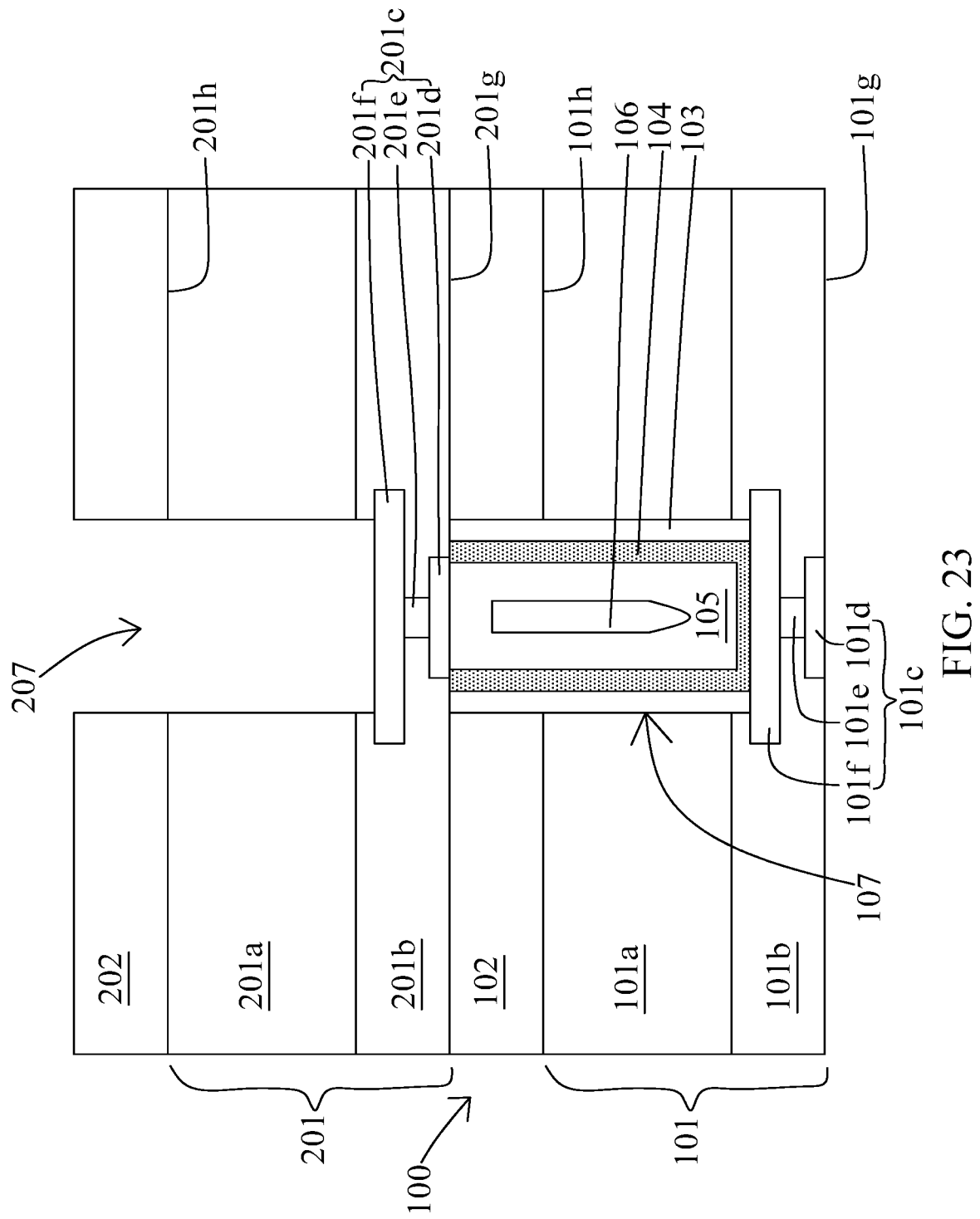

Referring to FIG. 23, portions of the second dielectric layer 201b, the second substrate 201a and the second passivation layer 202 are removed to form a second opening 207 exposing a portion of the second conductive pad 201f according to step S411 in FIG. 18. In some embodiments, the step S411 is similar to the step S403.

Figure 24:
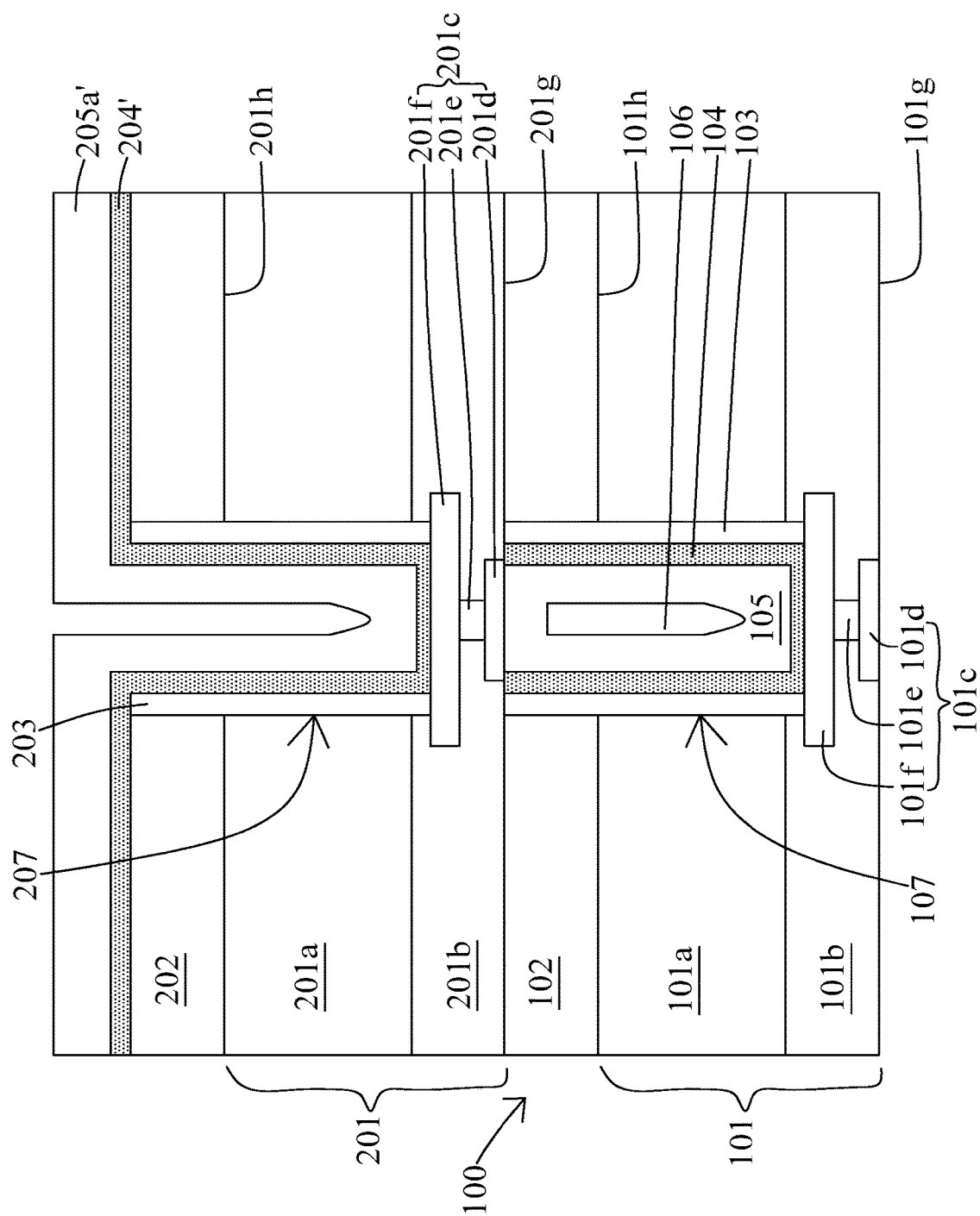

Referring to FIG. 24, a second dielectric liner 203 is formed within the second opening 207 as shown in FIG. 24. In some embodiments, the second dielectric liner 203 is formed by steps similar to those of the formation of the first dielectric liner 103.

In some embodiments, a second conductive barrier layer material 204' is disposed over the second passivation layer 202, conformal to the second dielectric liner 203 and within the second opening 207 as shown in FIG. 24. In some embodiments, materials and formation of the second conductive barrier layer material 204' are similar to those of the first conductive barrier layer material 104'.

In some embodiments, after the disposing of the second conductive barrier layer material 204', a seed layer is disposed over the second conductive barrier layer material 204'. In some embodiments, the seed layer is disposed by sputtering or another suitable operation. In some embodiments, the seed layer includes titanium, copper, nickel, gold or the like.

Referring to FIG. 24, a third conductive material 205a' is disposed within the second opening 207 according to step S412 in FIG. 18. In some embodiments, the step S412 is similar to the step S404.

Figure 25:
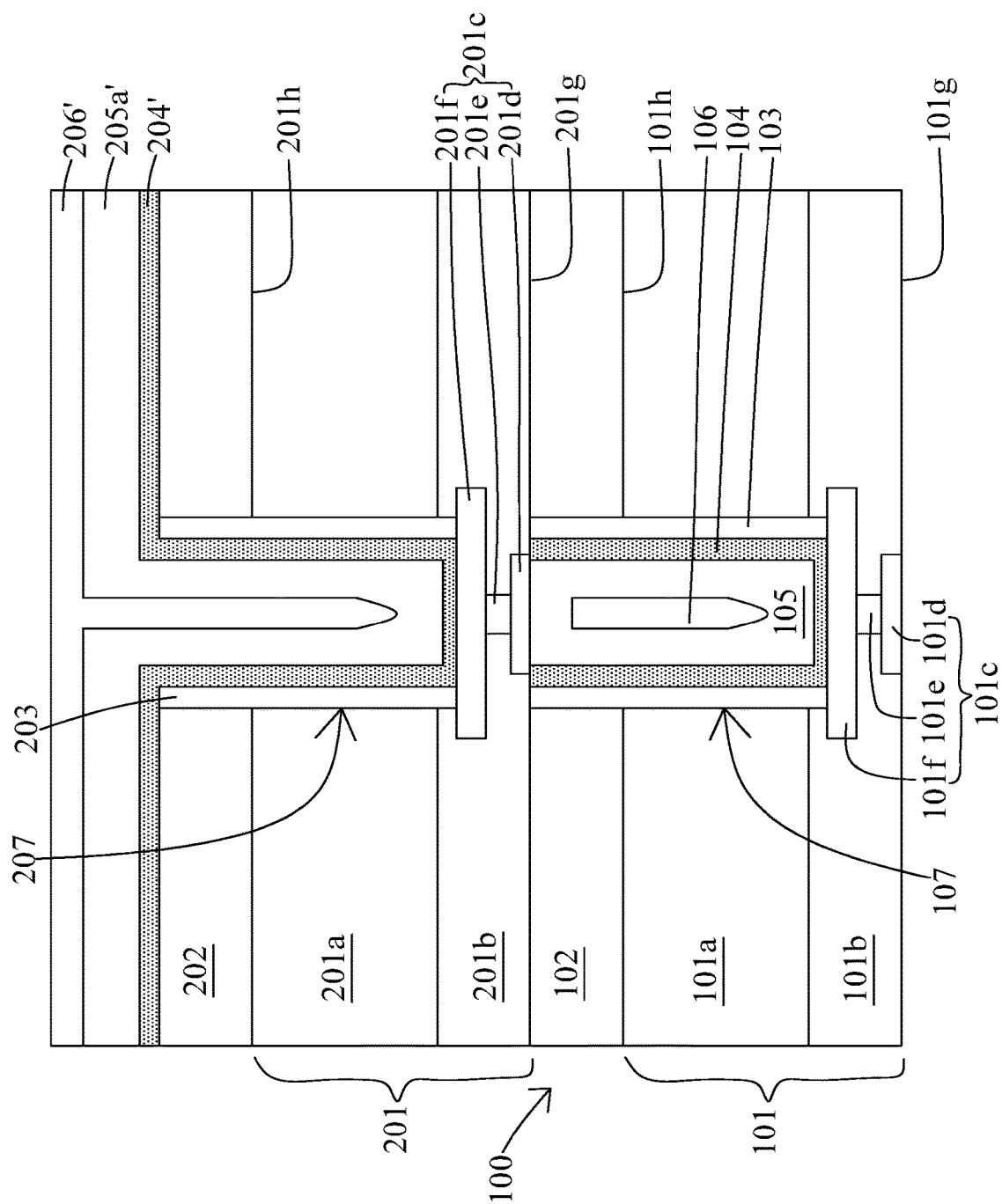

Referring to FIG. 25, a second elastic material 206' is disposed within the second opening 207 and surrounded by the third conductive material 205a' according to step S413 in FIG. 18. In some embodiments, the step S413 is similar to the step S405.

Figure 26:
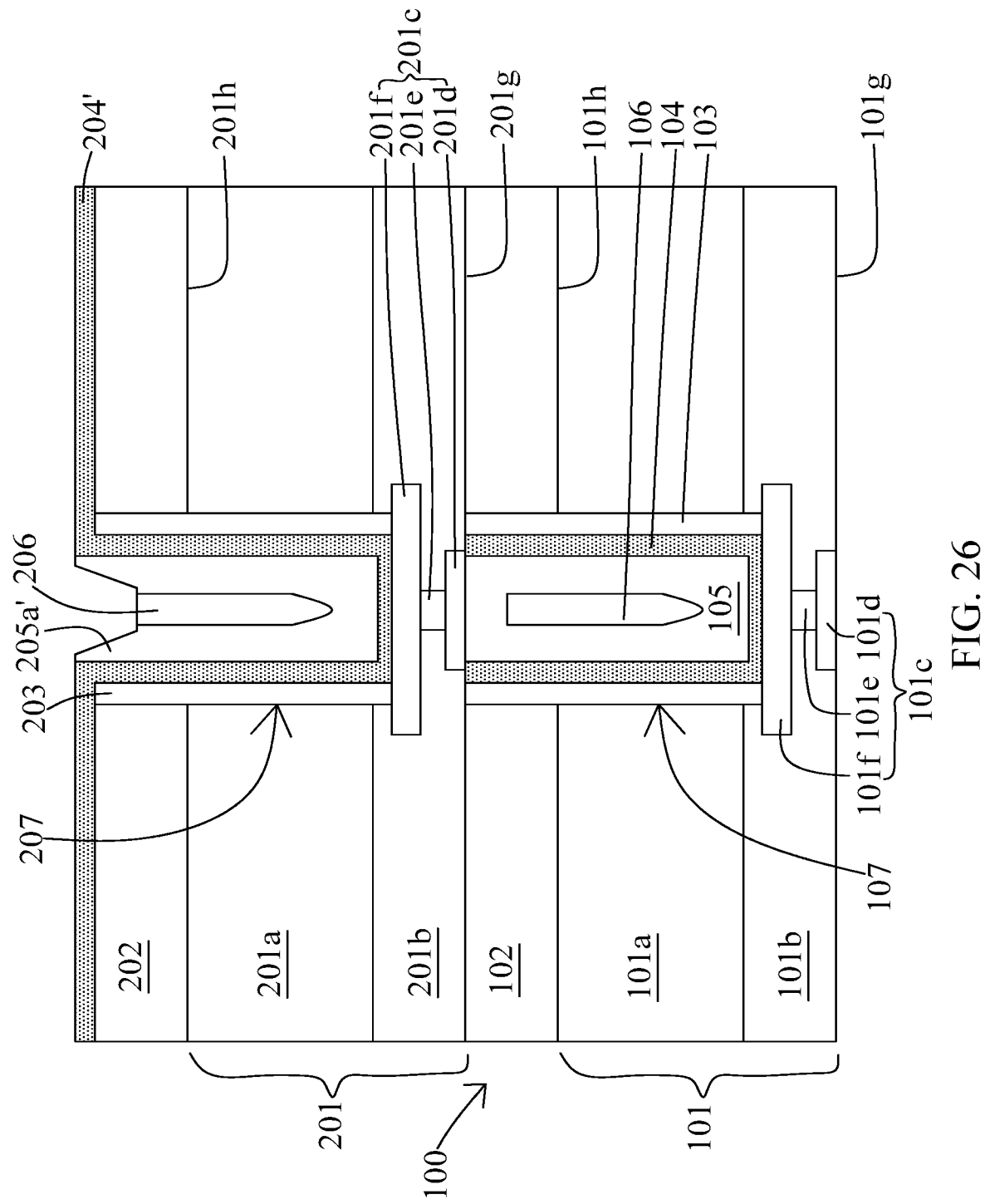

Referring to FIG. 26, portions of the third conductive material 205a' and the second elastic material 206' over the second conductive barrier layer material 204' and adjacent to an end of the second opening 207 are removed to form a second elastic member 206 according to step S414 in FIG. 18. In some embodiments, the step S414 is similar to the step S406.

Figure 27:
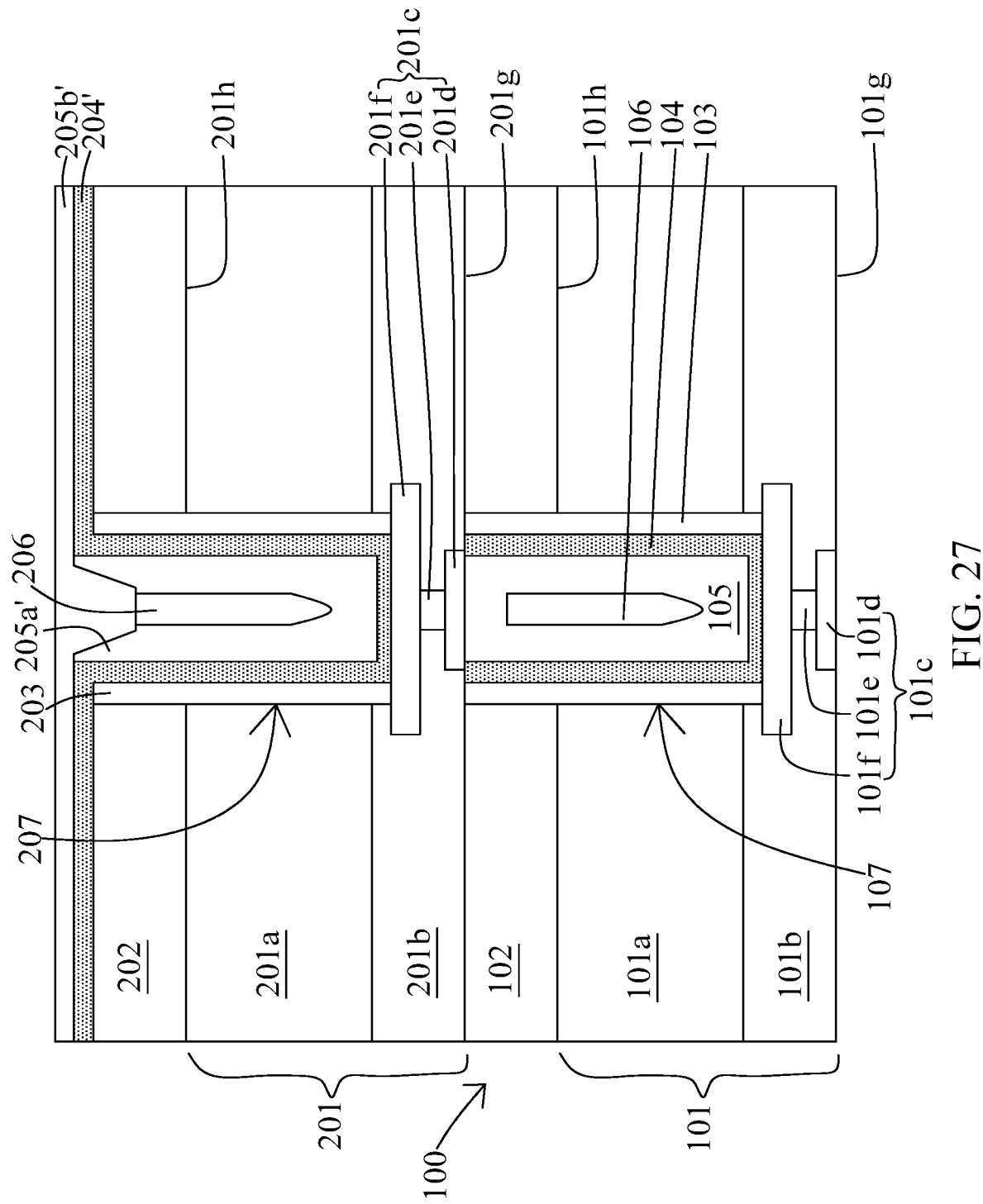
Figure 28:
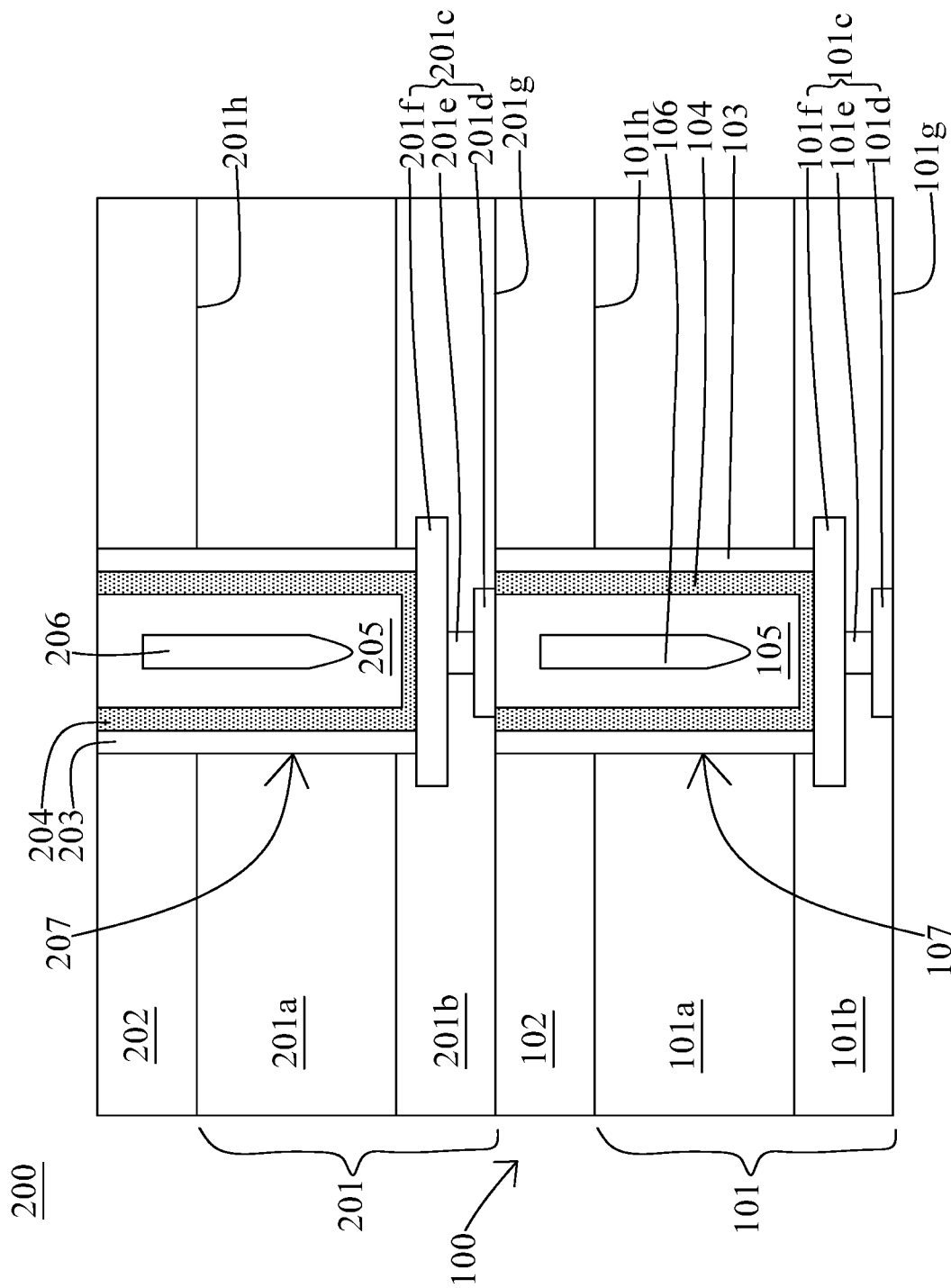

Referring to FIGS. 27 and 28, a fourth conductive material 205b' is disposed over the second elastic member 206, the third conductive material 205a', and the second conductive barrier layer material 204' to form a second conductive via 205 according to step S415 in FIG. 18. In some embodiments, the step S415 is similar to the step S407.

In some embodiments, after the disposing of the fourth conductive material 205b' as shown in FIG. 27, the fourth conductive material 205b' over the second passivation layer 202 is removed by planarization, CMP, etching or any other suitable process as shown in FIG. 28. In some embodiments, the second conductive barrier layer material 204' over the second passivation layer 202 is also removed. In some embodiments, the second conductive via 205 surrounds the second elastic member 206. In some embodiments, the second semiconductor structure 200 of FIG. 2 is formed as shown in FIG. 28.

In conclusion, because an elastic member capable of absorbing force is disposed within a via, a bonding force generated and applied over the via during a wafer-to-wafer bonding process can be effectively absorbed by the elastic member. Further, the elastic member is also capable of absorbing thermal stress from adjacent components such as the via during the bonding process. Therefore, formation of cracks within a wafer's bonded structure or damages to the wafer's bonded structure can be minimized or prevented.

One aspect of the present disclosure provides a semiconductor structure. The semiconductor structure includes a wafer including a substrate, a dielectric layer under the substrate, and a conductive pad surrounded by the dielectric layer; a passivation layer disposed over the substrate; a conductive via extending from the conductive pad through the substrate and the passivation layer and partially through the dielectric layer; and an elastic member disposed within the conductive via.

Another aspect of the present disclosure provides a semiconductor structure. The semiconductor structure includes a first wafer including a first substrate, a first dielectric layer under the first substrate, and a first conductive pad surrounded by the first dielectric layer; a first passivation layer disposed over the first substrate; a first conductive via extending from the first conductive pad through the first substrate and the first passivation layer and partially through the first dielectric layer; a first elastic member disposed within the first conductive via; a second wafer including a second dielectric layer bonded over the first passivation layer, a second substrate over the second dielectric layer, and a second conductive pad surrounded by the second dielectric layer; a second passivation layer disposed over the second substrate; a second conductive via extending from the second conductive pad through the second substrate and the second passivation layer and partially through the second dielectric layer; and a second elastic member disposed within the second conductive via.

Another aspect of the present disclosure provides a method of manufacturing a semiconductor structure. The method includes steps of providing a first wafer including a first substrate, a first dielectric layer under the first substrate, and a first conductive pad surrounded by the first dielectric layer; disposing a first passivation layer over the first substrate; removing portions of the first dielectric layer, the first substrate and the first passivation layer to form a first opening exposing a portion of the first conductive pad; disposing a first conductive material within the first opening; disposing a first elastic material within the first opening and surrounded by the first conductive material; removing portions of the first conductive material and the first elastic material adjacent to an end of the first opening to form a first elastic member; and disposing a second conductive material over the first elastic member and the first conductive material to form a first conductive via, wherein the first conductive via surrounds the first elastic member.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
   a wafer including a substrate, a dielectric layer under the substrate, and a conductive pad surrounded by the dielectric layer, wherein the conductive pad is disposed within the dielectric layer at a positioned above a bottom surface of the dielectric layer;
   a passivation layer disposed over the substrate;
   a conductive via extending from the conductive pad through the substrate and the passivation layer and partially through the dielectric layer, wherein a top surface of the conductive via is coplanar with a top surface of the passivation layer; and
   an elastic member disposed within the conductive via.

2. The semiconductor structure of claim 1, wherein the elastic member is surrounded by the substrate and the passivation layer.

3. The semiconductor structure of claim 1, wherein the elastic member includes organic material.

4. The semiconductor structure of claim 1, further comprising a dielectric liner between the conductive via and the wafer, and between the conductive via and the passivation layer, wherein a top surface of the dielectric liner is coplanar with the top surface of the conductive via and the top surface of the passivation layer.

5. The semiconductor structure of claim 4, wherein the dielectric liner surrounds the conductive via and the elastic member.

6. The semiconductor structure of claim 1, wherein a height of the conductive via is substantially greater than a height of the elastic member.

7. The semiconductor structure of claim 1, further comprising a conductive barrier layer, having a U-shaped cross section, surrounding the conductive via and the elastic member, wherein a bottom surface of the conductive barrier layer is in contact with the conductive pad and is positioned above the bottom surface of the dielectric layer.

8. The semiconductor structure of claim 7, wherein the conductive barrier layer is in contact with the conductive via and the conductive pad.

9. The semiconductor structure of claim 1, wherein at least a portion of the dielectric layer is disposed between the substrate and the conductive pad.

10. A semiconductor structure, comprising:
    a first wafer including a first substrate, a first dielectric layer under the first substrate, and a first conductive pad surrounded by the first dielectric layer;
    a first passivation layer disposed over the first substrate;
    a first opening extended through the first substrate and the first passivation layer and partially extended into the first dielectric layer at a position that a bottom of the first opening is formed above a bottom surface of the first dielectric layer so as to partially expose the first conductive pad;
    a first conductive via, which is disposed within the first opening, extending from the first conductive pad through the first substrate and the first passivation layer and partially through the first dielectric layer, wherein a top surface of the first conductive via is coplanar with a top surface of the first passivation layer;
    a first elastic member disposed within the first conductive via;
    a second wafer including a second dielectric layer bonded over the first passivation layer, a second substrate over the second dielectric layer, and a second conductive pad surrounded by the second dielectric layer;
    a second passivation layer disposed over the second substrate;
    a second opening extended through the second substrate and the second passivation layer and partially extended into the second dielectric layer at a position that a bottom of the second opening is formed above a bottom surface of the second dielectric layer so as to partially expose the second conductive pad;
    a second conductive via, which is disposed within the second opening, extending from the second conductive pad through the second substrate and the second passivation layer and partially through the second dielectric layer, wherein a top surface of the second conductive via is coplanar with a top surface of the second passivation layer; and
    a second elastic member disposed within the second conductive via.

11. The semiconductor structure of claim 10, wherein the second dielectric layer is in contact with the first conductive via.

12. The semiconductor structure of claim 10, further comprising:
    a third conductive pad electrically connected to the first conductive pad and at least partially exposed through the first dielectric layer; and
    a fourth conductive pad electrically connected to the second conductive pad and at least partially exposed through the second dielectric layer.

13. The semiconductor structure of claim 12, wherein the first conductive via is in contact with the fourth conductive pad.

14. The semiconductor structure of claim 12, wherein the third conductive pad is under the first conductive pad, and the fourth conductive pad is under the second conductive pad.

15. The semiconductor structure of claim 12, wherein the first conductive via is electrically connected to the second conductive via through the second conductive pad and the fourth conductive pad.

16. The semiconductor structure of claim 12, wherein the second conductive pad and the fourth conductive pad are disposed between the first conductive via and the second conductive via.

17. The semiconductor structure of claim 10, wherein the first conductive via is vertically aligned with the second conductive via, and the first conductive pad is vertically aligned with the second conductive pad.

18. The semiconductor structure of claim 10, wherein the first elastic member is vertically aligned with the second elastic member.

19. The semiconductor structure of claim 10, wherein the first conductive via is laterally offset from the second conductive via, and the first elastic member is laterally offset from the second elastic member.

20. The semiconductor structure of claim 10, wherein a thickness of the first wafer is substantially equal to a thickness of the second wafer.

* * * * *